US012795887B2

(12) United States Patent
Song

(10) Patent No.: US 12,795,887 B2
(45) Date of Patent: Nov. 10, 2026

(54) SEMICONDUCTOR DEVICE AND METHOD OF MANUFACTURING THE SAME

(71) Applicant: SK hynix Inc., Gyeonggi-do (KR)

(72) Inventor: Dong Il Song, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 346 days.

(21) Appl. No.: 18/440,101

(22) Filed: Feb. 13, 2024

(65) Prior Publication Data

US 2025/0120063 A1 Apr. 10, 2025

(30) Foreign Application Priority Data

Oct. 4, 2023 (KR) ........................ 10-2023-0131596

(51) Int. Cl.
*H10B 12/00* (2023.01)

(52) U.S. Cl.
CPC ............. *H10B 12/30* (2023.02); *H10B 12/03* (2023.02); *H10B 12/05* (2023.02)

(58) Field of Classification Search
CPC .......... H10B 12/30–12/488; H10B 12/05–056; H10D 30/6735
See application file for complete search history.

(56) References Cited

U.S. PATENT DOCUMENTS

2022/0157819 A1 5/2022 Jung et al.
2022/0173106 A1 6/2022 Choi et al.

*Primary Examiner* — Amar Movva
(74) *Attorney, Agent, or Firm* — IP & T GROUP LLP

(57) ABSTRACT

A method of manufacturing a semiconductor device may include forming a vertical stack comprising a plurality of recess target layers spaced apart from each other in a first direction over a lower structure; forming preliminary horizontal layers by recessing the recess target layers in a second direction perpendicular to the first direction; forming dielectric target layers on the preliminary horizontal layers; forming conductive target layers on the dielectric target layers; forming an inter-level dielectric layer by trimming the dielectric target layers in a third direction that intersects the second direction; forming horizontal layers by trimming the preliminary horizontal layers in the third direction; and forming trimmed target layers by trimming the conductive target layers in the third direction.

13 Claims, 36 Drawing Sheets

SEMICONDUCTOR DEVICE AND METHOD OF MANUFACTURING THE SAME

CROSS-REFERENCE TO RELATED APPLICATION

The present application claims priority under 35 U.S.C 119(a) to Korean Patent Application No. 10-2023-0131596, filed on Oct. 4, 2023, which is incorporated herein by reference in its entirety.

BACKGROUND

1. Field

Embodiments of the present disclosure relate to semiconductor device, and more particularly, to a semiconductor device including three-dimensional memory cells and a method of manufacturing the same.

2. Discussion of the Related Art

In order to handle consumer demand for higher capacity, higher performance, and more compact electronic devices, memory devices employing recently proposed 3-dimensional (3D) technology are being developed in which a plurality of memory cells are stacked in multiple layers. 3D semiconductor technology is very recent and further improvements are needed for structural stability, increased capacity and performance characteristics.

SUMMARY

Various embodiments of the present disclosure are directed to an improved 3D semiconductor device (hereinafter simply referred to simply as semiconductor device) having highly-integrated memory cells and a method of manufacturing the same.

In an embodiment of the present disclosure, a method of manufacturing a semiconductor device may include forming a vertical stack comprising a plurality of recess target layers spaced apart from each other in a first direction over a lower structure; forming preliminary horizontal layers by recessing the recess target layers in a second direction perpendicular to the first direction; forming dielectric target layers on the preliminary horizontal layers; forming conductive target layers on the dielectric target layers; forming an inter-level dielectric layer by trimming the dielectric target layers in a third direction that intersects the second direction; forming horizontal layers by trimming the preliminary horizontal layers in the third direction; and forming trimmed target layers by trimming the conductive target layers in the third direction.

In an embodiment of the present disclosure, a semiconductor device may include a lower structure; a memory cell array disposed at a higher level than the lower structure and that comprises a plurality of memory cells; and a supporter disposed between the lower structure and the memory cell array and that supports the memory cell array. Each of the memory cells comprises: cell isolation layers that contact the supporter and that are vertically oriented; a horizontal layer disposed between the cell isolation layers; a bit line connected to a first edge of the horizontal layer and that is vertically oriented over the lower structure; a data storage element horizontally isolated from the bit line and that is connected to a second edge of the horizontal layer; and a word line horizontally oriented in a direction that intersects the horizontal layer. A horizontal orientation length of the horizontal layer is smaller than a horizontal orientation length of the supporter. The semiconductor device further comprising: an inter-level dielectric layer disposed between the word line and the horizontal layer; and a horizontal layer level spacer disposed on a side of the horizontal layer. The horizontal layer level spacer is disposed between the cell isolation layers and the horizontal layer. A cross section of the horizontal layer has a cross shape. The word line comprises double word lines that face each other in a first direction with the horizontal layer interposed between the double word lines. The semiconductor device further comprising: a first contact node disposed between the vertical conductive line and a first edge of the horizontal layer; and a second contact node disposed between a second edge of the horizontal layer and the data storage element. The supporter and the lower structure comprise a semiconductor substrate, and the horizontal layer comprises single crystalline silicon.

In an embodiment of the present disclosure, a method of manufacturing a semiconductor device may include forming a stack body including a single crystalline silicon layer over a lower structure; forming a plurality of sacrificial vertical openings in the stack body; forming a single crystalline silicon layer pattern by recessing the single crystalline silicon layer that is exposed by the sacrificial vertical openings; forming a gate dielectric layer on the single crystalline silicon layer pattern; forming a conductive layer on the gate dielectric layer; forming a plurality of cell isolation openings in the stack body; trimming the gate dielectric layer that is exposed by the cell isolation openings; forming a horizontal layer by trimming the single crystalline silicon layer pattern that is exposed by the cell isolation openings; trimming the conductive layer that is exposed by the cell isolation openings, and forming cell isolation layers that fill the cell isolation openings.

Other features, aspects, and advantages of the present invention will become apparent from the following detailed description, the drawings, and the claims.

DETAILED DESCRIPTION

Figure 1A:
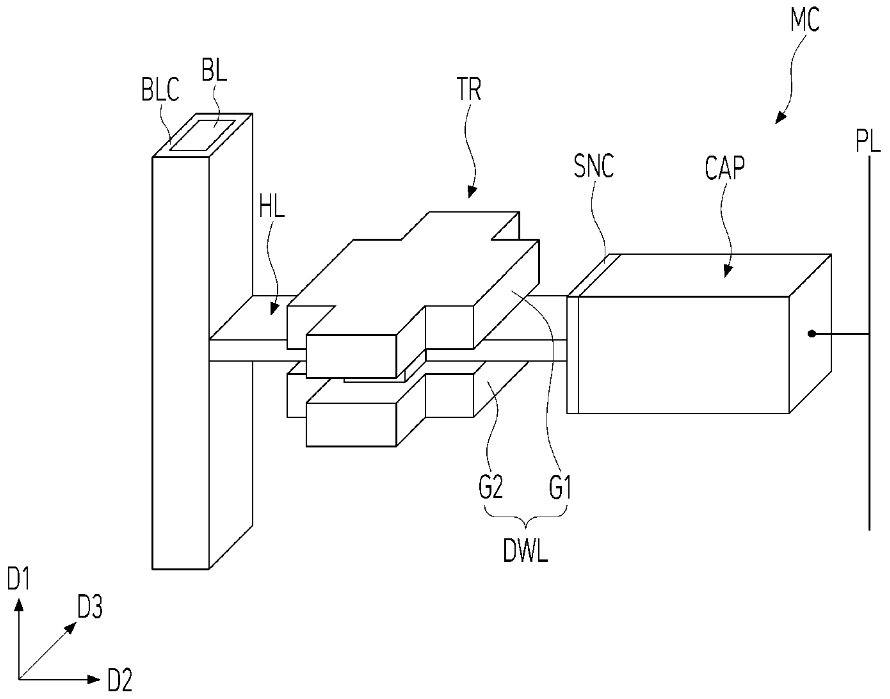
FIG. 1A is a schematic perspective view of a memory cell according to an embodiment of the present disclosure.

Embodiments described in this specification may be described with reference to cross-sectional views, plan views, and block diagrams which are ideal schematic diagrams of the present disclosure. Accordingly, forms of diagrams may be changed by a manufacturing technology and/or a tolerance. Accordingly, the embodiments of the present disclosure are limited to the illustrated specific forms, but may also include a change in a form that is generated according to a manufacturing process. Accordingly, regions illustrated in the drawings have approximate attributes, and forms of the regions illustrated in the drawings are provided to illustrate specific forms of the areas of a device and are not intended to limit the category of the present disclosure.

The following embodiments relate to three-dimensional (3-D) memory cell and a semiconductor with vertically stacked 3-D memory cells. The semiconductor has increased memory cell density and reduced parasitic capacitance.

Figure 1B:
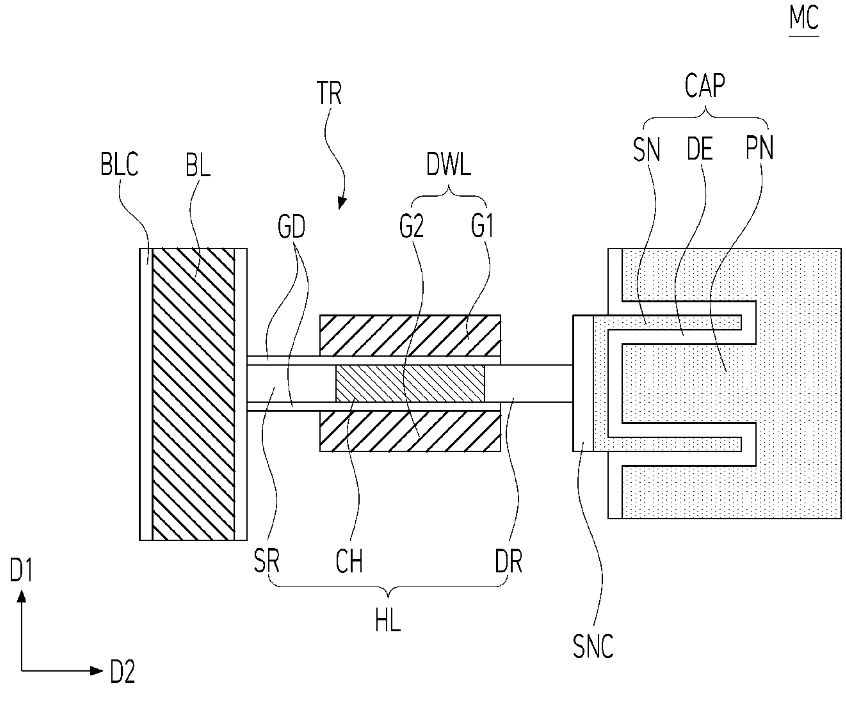
FIG. 1B is a schematic cross-sectional view of the memory cell illustrated in FIG. 1A.
Figure 1C:
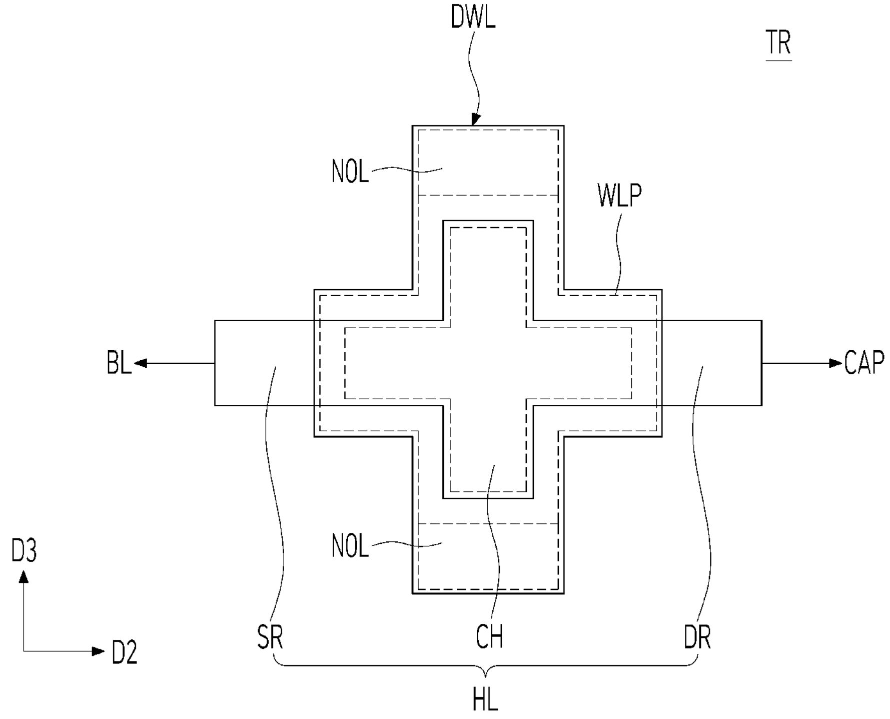
FIG. 1C is a plan view of a switching element illustrated in FIG. 1A.

FIG. 1A is a simplified schematic perspective view of a memory cell according to an embodiment of the present disclosure. FIG. 1B is a simplified schematic cross-sectional view of the memory cell illustrated in FIG. 1A. FIG. 1C is a plan view of a switching element illustrated in FIG. 1A.

Referring to FIGS. 1A to 1C, a memory cell MC may include a first conductive line BL, a switching element TR, and a data storage element CAP, with the switching element TR being disposed between the first conductive line BL and the data storage element CAP.

The first conductive line BL may be vertically oriented in a first direction D1. The first conductive line BL may include a bit line. The first conductive line BL may also be referred to as a vertical conductive line, a vertically oriented bit line, a vertically extended bit line, or a pillar-shaped bit line. The first conductive line BL may include a conductive material. The first conductive line BL may include a silicon-based material, a metal-based material, or any combination thereof. For example, the first conductive line BL may include polysilicon, metal, metal nitride, metal silicide, or any combination thereof. In an embodiment, the first conductive line BL may include polysilicon, titanium nitride, tungsten, or any combination thereof. In an embodiment, the first conductive line BL may include a stack of titanium nitride and tungsten (TiN/W).

The switching element TR has a function for controlling the voltage supply (or current) to the data storage element CAP during a data write operation and/or a data read operation for the data storage element CAP. The switching element TR may include a horizontal layer HL extending in the second direction D2, an inter-level dielectric layer GD, and a second conductive line DWL. The second conductive line DWL may include a horizontal conductive line or a horizontal word line. The horizontal layer HL may include an active layer. The switching element TR may include a transistor. In this case, the second conductive line DWL may play a role as a gate electrode. The switching element TR may also be referred to as an access element or a selection element. The second conductive line DWL may also be referred to as a horizontal gate electrode or a horizontal word line.

The horizontal layer HL may extend in a second direction D2 that intersects the first direction D1. The second conductive line DWL may extend in a third direction D3 that intersects the first direction D1 and the second direction D2. The first direction D1 may be a vertical direction. The second and third directions D2 and may be a first horizontal direction and a second horizontal direction, respectively. The horizontal layer HL may extend in the first horizontal direction (i.e., the second direction D2). The second conductive line DWL may extend in the second horizontal direction (i.e., the third direction D3).

The horizontal layer HL may include a semiconductor material, including, for example, polysilicon, single crystalline silicon, germanium, or silicon-germanium. In an embodiment, the horizontal layer HL may include an oxide semiconductor material. For example, the oxide semiconductor material may include indium gallium zinc oxide (IGZO). In an embodiment, the horizontal layer HL may include a conductive metal oxide.

The upper (top) and lower (bottom) surfaces of the horizontal layer HL may each be flat. That is, the upper and lower surfaces of the horizontal layer HL may be parallel to each other in the second direction D2.

The horizontal layer HL may include a channel CH, a first doped region SR between the channel CH and the first conductive line BL, and a second doped region DR between the channel CH and the data storage element CAP. If the horizontal layer HL is an oxide semiconductor material, the channel CH may be made of an oxide semiconductor material, and the first and second doped regions SR and DR may be omitted. The horizontal layer HL may also be referred to as an active layer or a thin body.

Impurities having the same conductive type may be doped into the first doped region SR and the second doped region DR. N type conductive type impurities may be doped into the first doped region SR and the second doped region DR, but P type conductive type impurities may be doped into the first doped region SR and the second doped region DR. The first doped region SR and the second doped region DR may include at least one impurity selected from among arsenic (As), phosphorus (P), boron (B), indium (In), and any combination thereof. The first doped region SR may be connected to the first conductive line BL. The second doped region DR may be connected to the data storage element CAP. The first and second doped regions SR and DR may also be referred to as first and second source/drain regions, respectively.

The horizontal layer HL may be horizontally oriented in the second direction D2 from the first conductive line BL.

The second conductive line DWL may have a double structure. For example, the second conductive line DWL may include an upper horizontal line G1 and a lower horizontal line G1 that face each other with the horizontal layer HL interposed therebetween. The inter-level dielectric layer GD may be formed on the upper and lower surfaces of the horizontal layer HL. The upper horizontal line G1 may be disposed on the upper side of the horizontal layer HL. The lower horizontal line G2 may be disposed on the lower side of the horizontal layer HL. The second conductive line DWL may include a pair of the upper horizontal line G1 and the lower horizontal line G2. In the second conductive line DWL, the same driving voltage may be applied to the upper horizontal line G1 and the lower horizontal line G2. For example, the upper horizontal line G1 and the lower horizontal line G2 may form a pair, and may be coupled to one memory cell MC. In another embodiment, different driving voltages may be applied to the upper horizontal line G1 and the lower horizontal line G2. In this case, one of the upper horizontal line G1 and the lower horizontal line G2 may play a role as a back gate or a shield gate.

The second conductive line DWL may include a metal-based material, a semiconductor material, or any combination thereof. The second conductive line DWL may include titanium nitride, tungsten, polysilicon, or any combination thereof. For example, the second conductive line DWL may include a TiN/W stack on which titanium nitride and tungsten have been sequentially stacked. The second conductive line DWL may include an N type work function material or a P type work function material. The N type work function material may have a low work function of 4.5 eV or less. The P type work function material may have a high work function of more than 4.5 eV. The second conductive line DWL may include a stack of the low work function material and the high work function material.

In each of the upper horizontal line G1 and the lower horizontal line G2, a width in the second direction D2, for example, the width of an overlap portion overlapping with the horizontal layer HL may be greater than the width of a portion that does not overlap with the horizontal layer HL. The sidewalls of the second conductive line DWL, which extend in the third direction D3, may have notch-shaped sidewalls due to such a difference between the widths.

Referring back to FIG. 1C, the second conductive line DWL may include a channel overlapping portion WLP and a channel non-overlapping portion NOL. The channel overlapping portion WLP refers to a portion overlapping with the channel CH of the horizontal layer HL. The channel non-overlapping portion NOL refers to a portion that does not overlap with the horizontal layer HL. The channel overlapping portion WLP may have a cross shape. In an embodiment (not shown), the channel overlapping portion may have a diamond shape. In another embodiment, the sides of the channel overlapping portion WLP may each have a bent shape or a rounded shape.

The channel CH and the channel overlapping portion WLP of the second conductive line DWL may be overlapped. The channel CH may have cross shape as illustrated, or in another embodiment (not shown) may have a diamond shape. The size of the channel overlapping portion WLP of the second conductive line DWL may be greater than the size of the channel CH. The channel overlapping portion WLP of the second conductive line DWL may fully overlap with the channel CH.

From a top view, the horizontal layer HL may have a cross shape as illustrated, or in another embodiment (not shown) may have a diamond shape. In another embodiment, the sides of the horizontal layer HL may each have a bent shape or a rounded shape.

The inter-level dielectric layer GD may be disposed between the horizontal layer HL and the second conductive line DWL. The inter-level dielectric layer GD may also be referred to as a gate dielectric layer. The inter-level dielectric layer GD may also be referred to as a horizontal layer-side dielectric layer. The inter-level dielectric layer GD may include silicon oxide, silicon nitride, metal oxide, metal oxynitride, metal silicate, a high-k material, a ferroelectric material, an anti-ferroelectric material, or any combination thereof. The inter-level dielectric layer GD may include $SiO_2$, $Si_3N_4$, $HfO_2$, $Al_2O_3$, $ZrO_2$, AlON, HfON, HfSiO, HfSiON, HfZrO, or any combination thereof. The inter-level dielectric layer GD may be formed by the thermal oxidation of a semiconductor material.

The data storage element CAP may include a memory element, such as a capacitor. The data storage element CAP may be horizontally disposed in the second direction D2 from the switching element TR. The data storage element CAP may include a first electrode SN that horizontally extends from the horizontal layer HL in the second direction D2. The data storage element CAP may further include a second electrode PN over the first electrode SN, and a dielectric layer DE between the first electrode SN and the second electrode PN. The first electrode SN, the dielectric layer DE, and the second electrode PN may be horizontally arranged in the second direction D2. The first electrode SN may include an inner space and a plurality of outer surfaces. The inner space of the first electrode SN may include a plurality of inner surfaces. The outer surfaces of the first electrode SN may include a vertical outer surface and a plurality of horizontal outer surfaces. The vertical outer surface of the first electrode SN may vertically extend in the first direction D1. The horizontal outer surfaces of the first electrode SN may horizontally extend in the second direction D2 or the third direction D3. The inner space of the first electrode SN may be a 3-D space. The dielectric layer DE may conformally cover the inner surfaces and outer surfaces of the first electrode SN. The second electrode PN may be disposed in the inner space of the first electrode SN on the dielectric layer DE. Some of the outer surfaces of the first electrode SN may be electrically connected to the second doped region DR of the horizontal layer HL.

The data storage element CAP may have a 3-D structure. The first electrode SN may have a 3-D structure, but the first electrode SN of the 3-D structure may have a horizontal 3-D structure that is oriented in the second direction D2. As an example of the 3-D structure, the first electrode SN may have a cylinder shape. The cylinder shape of the first electrode SN may include cylinder inner surfaces and cylinder outer surfaces. Some of the cylinder outer surfaces of the first electrode SN may be electrically connected to the second doped region DR of the horizontal layer HL. The dielectric layer DE and the second electrode PN may be disposed on the cylinder inner surfaces of the first electrode SN.

In another embodiment, the first electrode SN may have a pillar shape or a pylinder shape. The pylinder shape may denote a structure in which a pillar shape and a cylinder shape have been merged.

The first electrode SN and the second electrode PN may each include metal, precious metal, metal nitride, conductive metal oxide, conductive precious metal oxide, metal carbide, metal silicide, or any combination thereof. For example, the first electrode SN and the second electrode PN may each include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, a tungsten nitride/tungsten (WN/W) stack, or any combination thereof. The second electrode PN may include a combination of a metal-based material and a silicon-based material. For example, the second electrode PN may be a titanium nitride/silicon germanium/tungsten nitride (TiN/SiGe/WN) stack. In the titanium nitride/silicon germanium/tungsten nitride (TiN/SiGe/WN) stack, silicon germanium may be a gap-fill material that fills the inside of the first electrode SN. Titanium nitride (TiN) may play a role as the second electrode PN of the data storage element CAP. Tungsten nitride may be a low resistance material.

The dielectric layer DE may also be referred to as a capacitor dielectric layer or a memory layer. The dielectric layer DE may include silicon oxide, silicon nitride, a high-k material, or any combination thereof. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). In another embodiment, the dielectric layer DE may be composed of a composite layer including two layers or more of the high-k materials.

The dielectric layer DE may be formed of zirconium (Zr)-based oxide. The dielectric layer DE may have a stack structure including zirconium oxide ($ZrO_2$). The dielectric layer DE may include a $ZrO_2/Al_2O_3$ (ZA) stack or a $ZrO_2/Al_2O_3/ZrO_2$ (ZAZ) stack. The ZA stack may have a structure in which aluminum oxide ($Al_2O_3$) has been stacked on zirconium oxide ($ZrO_2$). The ZAZ stack may have a structure in which zirconium oxide ($ZrO_2$), aluminum oxide ($Al_2O_3$), and zirconium oxide ($ZrO_2$) have been sequentially stacked. The ZA stack and the ZAZ stack may each also be referred to as a $ZrO_2$-based layer. In another embodiment, the dielectric layer DE may be formed of HF-based oxide. The dielectric layer DE may have a stack structure including hafnium oxide ($HfO_2$). The dielectric layer DE may include a $HfO_2/Al_2O_3$ (HA) stack or a $HfO_2/Al_2O_3/HfO_2$ (HAH) stack. The HA stack may have a structure in which aluminum oxide ($Al_2O_3$) has been stacked on hafnium oxide ($HfO_2$). The HAH stack may have a structure in which hafnium oxide ($HfO_2$), aluminum oxide ($Al_2O_3$), and hafnium oxide ($HfO_2$) have been sequentially stacked. The HA stack and the HAH stack may each also be referred to as a $HfO_2$-based layer. In the ZA stack, the ZAZ stack, the HA stack, and the HAH stack, aluminum oxide ($Al_2O_3$) may have greater bandgap energy than each of zirconium oxide ($ZrO_2$) and hafnium oxide ($HfO_2$). Aluminum oxide ($Al_2O_3$) may have a low dielectric constant than each of zirconium oxide ($ZrO_2$) and hafnium oxide ($HfO_2$). Accordingly, the dielectric layer DE may include a stack of a high-k material and a high bandgap material having greater bandgap energy than the high-k material. The dielectric layer DE may include silicon oxide ($SiO_2$) as another high bandgap material in addition to aluminum oxide ($Al_2O_3$). The dielectric layer DE may include the high bandgap material, so that the leakage current of the dielectric layer DE can be suppressed. The high bandgap material may be thinner than the high-k material. In another embodiment, the dielectric layer DE may have a stacked structure in which the high-k material and the high bandgap material have been alternately stacked. For dielectric example, the layer DE may include a $ZrO_2/Al_2O_3/ZrO_2/Al_2O_3$ (ZAZA) stack, a $ZrO_2/Al_2O_3/ZrO_2/Al_2O_3/ZrO_2$ (ZAZAZ) stack, a $HfO_2/Al_2O_3/HfO_2/Al_2O_3$ (HAHA) stack, or a $HfO_2/Al_2O_3/HfO_2/Al_2O_3/HfO_2$ (HAHAH) stack. In such a stack structure, aluminum oxide ($Al_2O_3$) may be thinner than each of zirconium oxide ($ZrO_2$) and hafnium oxide ($HfO_2$).

In another embodiment, the dielectric layer DE may include the high-k material and the high bandgap material, but may have a laminated structure in which a plurality of high-k materials and a plurality of high bandgap materials have been laminated or a mixing structure in which the high-k material and the high bandgap material have been intermixed.

In another embodiment, the dielectric layer DE may include a ferroelectric material, an anti-ferroelectric material, or any combination thereof. For example, the dielectric layer DE may include HfZrO.

In another embodiment, the dielectric layer DE may include a combination of a high-k material and a ferroelectric material, a combination of a high-k material and an anti-ferroelectric material, or a combination of a high-k material, or a ferroelectric material and an anti-ferroelectric material.

In another embodiment, an interface control layer for improving a leakage current may be further formed between the first electrode SN and the dielectric layer DE. The interface control layer may include titanium oxide ($TiO_2$), tantalum oxide ($Ta_2O_5$), niobium oxide ($Nb_2O_5$), niobium nitride (NbN), or any combination thereof. The interface control layer may also be formed between the second electrode PN and the dielectric layer DE.

The data storage element CAP may include a 3-D capacitor. The data storage element CAP may include a metal-insulator-metal (MIM) capacitor. The data storage element CAP may be substituted with another data storage material. For example, the data storage material may be a thyristor, a phase change material, a magnetic tunnel junction (MTJ), or a variable resistance material.

For example, the memory cell MC may include a thyristor. The first conductive line BL may be a cathode line. The data storage element CAP may be substituted with an anode line. The horizontal layer HL may include four semiconductor layers that have been horizontally stacked in the second direction D2. The thyristor may include a first diode and a second diode that are connected in series. When a forward bias having the same voltage is applied to the thyristor, the thyristor may have a high conductance state in which a high current flows or a low conductance state in which a low current flows or a current does not flow. The memory cell MC may have a state "1" and a state "0" by using the high conductance state and low conductance state of the thyristor, respectively.

Referring back to FIGS. 1A and 1B, the memory cell MC may further include a first contact node BLC and a second contact node SNC. The first contact node BLC may surround the outer wall of the first conductive line BL. The second contact node SNC may be disposed between the horizontal layer HL and the first electrode SN. The first contact node BLC may include a metal-based material or a semiconductor material. The second contact node SNC may include a metal-based material or a semiconductor material. For example, the first and second contact nodes BLC and SNC may each include titanium, titanium nitride, tungsten, or any combination thereof. Furthermore, the first and second contact nodes BLC and SNC may each include doped polysilicon. The first doped region SR and the second doped region DR may include impurities that have been diffused from the first and second contact nodes BLC and SNC, respectively.

Figure 1D:
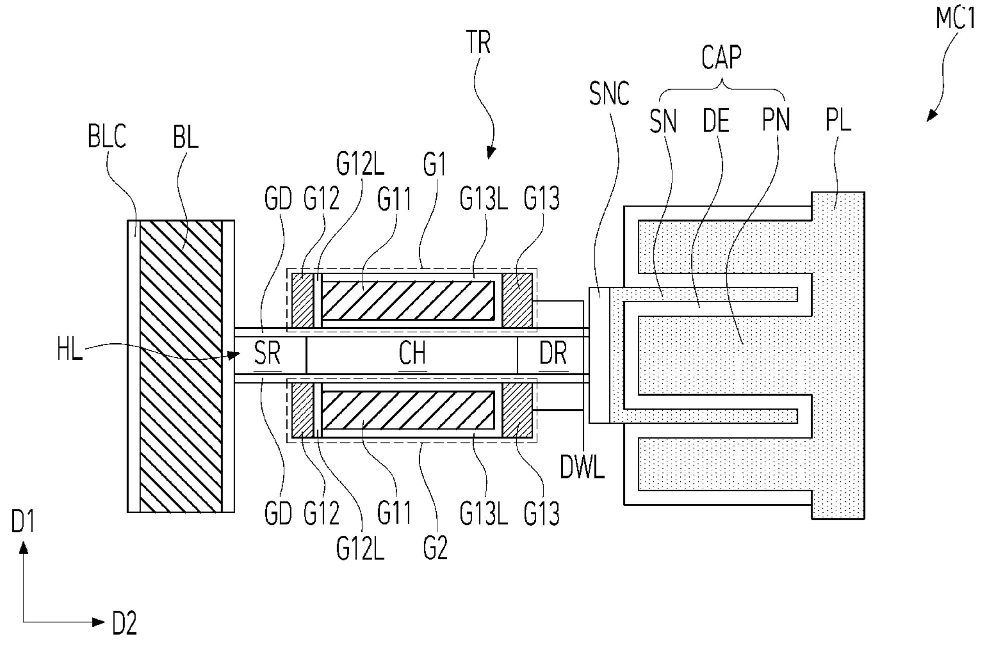
FIG. 1D is a schematic cross-sectional view of a memory cell according to another embodiment of the present disclosure.

FIG. 1D is a simplified schematic cross-sectional view of a memory cell according to another embodiment of the present disclosure. A memory cell MC1 illustrated in FIG. 1D may be similar to the memory cell MC illustrated in FIGS. 1A to 1C. Hereinafter, a detailed description of redundant components may be omitted.

The memory cell MC1 may include a first conductive line BL, a switching element TR, and a data storage element CAP. The switching element TR may include a horizontal layer HL, an inter-level dielectric layer GD, and a second conductive line DWL. The horizontal layer HL may include a first doped region SR, a second doped region DR, and a channel CH. The data storage element CAP may include a first electrode SN, a second electrode PN, and a dielectric layer DE.

The memory cell MC1 may further include a first contact node BLC between the first conductive line BL and the horizontal layer HL and a second contact node SNC between the horizontal layer HL and the data storage element CAP. The first and second contact nodes BLC and SNC may each include doped polysilicon. The first doped region SR and the second doped region DR may include impurities that have been diffused from the first and second contact nodes BLC and SNC, respectively.

The second conductive line DWL may include an upper horizontal line G1 and a lower horizontal line G2. The upper horizontal line G1 and the lower horizontal line G2 may each include a first work function electrode G11, a second work function electrode G12, and a third work function electrode G13. The second work function electrode G12, the first work function electrode G11, and the third work function electrode G13 may be horizontally disposed in a second direction D2. The first work function electrode G11, the second work function electrode G12, and the third work function electrode G13 may come in direct contact with each other. The second work function electrode G12 may be adjacent to the first conductive line BL. The third work function electrode G13 may be adjacent to the data storage element CAP. The first work function electrode G11 may be disposed between the second work function electrode G12 and the third work function electrode G13. The horizontal layer HL may have a smaller thickness than the first, second, and third work function electrodes G11, G12, and G13.

The first work function electrode G11, the second work function electrode G12, and the third work function electrode G13 may be formed of different work function materials. The first work function electrode G11 may have a higher work function than each of the second and third work function electrodes G12 and G13. The first work function electrode G11 may include a high work function material. The first work function electrode G11 may have a higher work function than the mid-gap work function of silicon. The second and third work function electrodes G12 and G13 may each include a low work function material. The second and third work function electrodes G12 and G13 may each have a work function lower than the mid-gap work function of silicon. Incidentally, the high work function material may have a work function higher than 4.5 eV. The low work function material may have a work function lower than 4.5 eV. The first work function electrode G11 may include a metal-based material. The second and third work function electrodes G12 and G13 may each include a semiconductor material.

The second and third work function electrodes G12 and G13 may each include N-type dopant-doped polysilicon. The first work function electrode G11 may include metal, metal nitride, or any combination thereof. The first work function electrode G11 may include tungsten, titanium nitride, or any combination thereof. A barrier material may be further formed between the second and third work function electrodes G12 and G13 and the first work function electrode G11.

In an embodiment, the upper and lower horizontal lines G1 and G2 of the second conductive line DWL may be horizontally disposed in order of the second work function electrode G12—the first work function electrode G11—the third work function electrode G13 in the second direction D2. The first work function electrode G11 may include metal. The second work function electrode G12 and the third work function electrode G13 may each include polysilicon.

The upper and lower horizontal lines G1 and G2 of the second conductive line DWL may each have a poly Si-metal-poly Si (PMP) structure that is horizontally disposed in the second direction D2. In the PMP structure, the first work function electrode G11 may include a metal-based material, and the second and third work function electrodes G12 and G13 may each include N-type dopant-doped polysilicon. The N type dopant may include phosphorus or arsenic.

A first barrier layer G12L may be disposed between the first work function electrode G11 and the second work function electrode G12. A second barrier layer G13L may be disposed between the first work function electrode G11 and the third work function electrode G13. The first and second barrier layers G12L and G13L may each include titanium nitride, tantalum nitride, tungsten nitride, or molybdenum nitride. The second barrier layer G13L may cover an upper surface, lower surface, and one side of the first work function electrode G11.

The first work function electrode G11 may have greater volume than each of the second and third work function electrodes G12 and G13. Accordingly, the second conductive line DWL may have low resistance. The first work function electrodes G11 of the upper and lower horizontal lines G1 and G2 may be vertically overlapped in the first direction D1 with the horizontal layer HL interposed therebetween. The second and third work function electrodes G12 and G13 of the upper and lower horizontal lines G1 and G2 may be vertically overlapped in the first direction D1 with the horizontal layer HL interposed therebetween. An overlap area of the first work function electrode G11 and the horizontal layer HL may be greater than an overlap area between each of the second and third work function electrodes G12 and G13 and the horizontal layer HL. The first work function electrode G11 may extend in a third direction D3. The second and third work function electrodes G12 and G13 may each have an independent structure overlapping with the horizontal layer HL. For example, the first work function electrode G11 may include a channel overlapping portion WLP and a channel non-overlapping portion NOL. The second and third work function electrodes G12 and G13 may each be a part of the channel overlapping portion WLP. The second and third work function electrodes G12 and G13 and the first work function electrode G11 may come in direct contact with each other.

As described above, the upper and lower horizontal lines G1 and G2 may each have a triple-work function electrode structure that includes the first, second, and third work function electrodes G11, G12, and G13. The second conductive line DWL may include the pair of first work function electrodes G11, the pair of second work function electrodes G12, and the pair of third work function electrodes G13, each one extending in the third direction D3 across the horizontal layer HL, with the horizontal layer HL interposed between each of the pair of first work function electrodes G11, the pair of second work function electrodes G12, and the pair of third work function electrodes G13. The first work function electrodes G11, the second work function electrodes G12, and the third work function electrodes G13 may vertically overlap with the channel CH.

The second conductive lines DWL may each include the channel overlapping portion WLP and the channel non-overlapping portion NOL, such as those illustrated in FIG. 1C. The channel overlapping portion WLP may have a cross shape. In an embodiment (not shown), the channel overlapping portion WLP may have a diamond shape. The channel overlapping portions WLP may fully overlap with the channel CH. The second conductive line DWL extending in the third direction D3 may have notch-shaped sidewalls by the channel overlapping portions WLP and the channel non-overlapping portions NOL. From a top view, the notch-shaped sidewalls may be provided by the protruding portions of the channel overlapping portions WLP and the recessed portions of the channel non-overlapping portions NOL. The channel overlapping portions WLP may include the first work function electrodes G11, the second work function electrodes G12, and the third work function electrodes G13. The first work function electrodes G11, the second work function electrodes G12, and the third work function electrodes G13 may vertically overlap with the channel CH.

The first work function electrode G11 having a high work function may be disposed at a central part of the second conductive line DWL and the second and third work function electrodes G12 and G13 each having a low work function may be disposed on both sides of the second conductive line DWL in the second direction D2. A leakage current, such as gate induced drain leakage (GIDL), may thus be reduced significantly.

The threshold voltage of the switching element TR may, thus, be increased significantly because the first work function electrode G11 having a high work function is disposed at the central part of the second conductive line DWL. A low electric field may be formed between the first conductive line BL and the second conductive line DWL because the second work function electrode G12 of the second conductive line DWL has a low work function. A low electric field may be formed between the data storage element CAP and the second conductive line DWL because the third work function electrode G13 of the second conductive line DWL has a low work function.

As described above, the memory cell MC1 may include the second conductive line DWL having the triple work function electrode structure. Each of the upper and lower horizontal lines G1 and G2 of the second conductive line DWL may include the first work function electrode G11, the second work function electrode G12, and the third work function electrode G13. The first work function electrode G11 may overlap with the channel CH. The second work function electrode G12 may be adjacent to the first conductive line BL and the first doped region SR. The third work function electrode G13 may be adjacent to the data storage element CAP and the second doped region DR. A leakage current may, thus, be reduced significantly because a low electric field is formed between the second conductive line DWL and the first conductive line BL due to the low work function of the second work function electrode G12. A leakage current may, thus, be reduced significantly because a low electric field is formed between the second conductive line DWL and the data storage element CAP due to the low work function of the third work function electrode G13. The threshold voltage of the switching element TR may, thus, be increased significantly due to the high work function of the first work function electrode G11. Furthermore, it has been found to be advantageous in terms of the degree of integration because the height of the memory cell MC1 can be lowered significantly due to the high work function of the first work function electrode G11.

Figure 2:
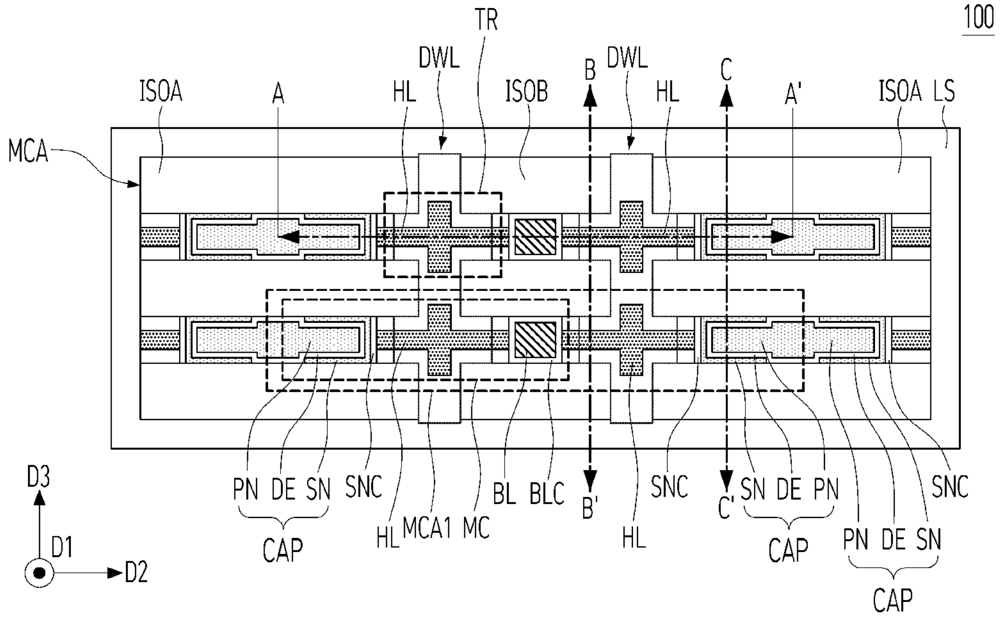
FIG. 2 is a schematic plan view of a semiconductor device according to an embodiment of the present disclosure.
Figure 3A:
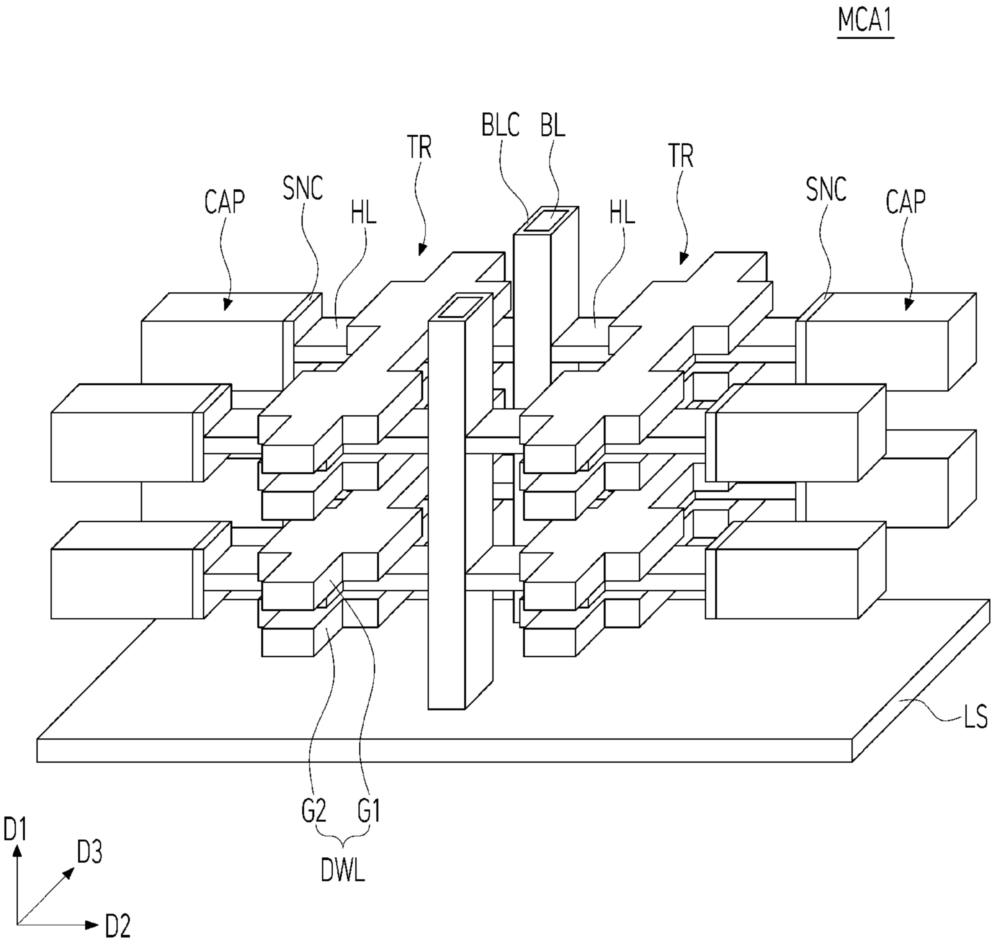
FIG. 3A is a schematic perspective view of a first memory cell array MCA1 illustrated in FIG. 2.
Figure 3B:
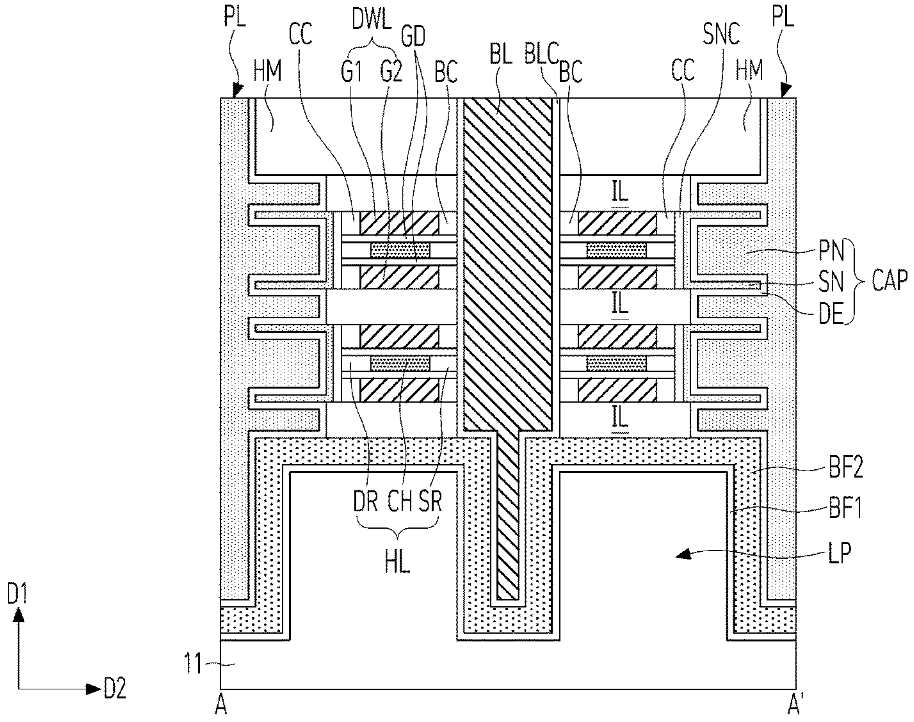
FIG. 3B is a cross-sectional view taken along line A-A' in FIG. 2.
Figure 3C:
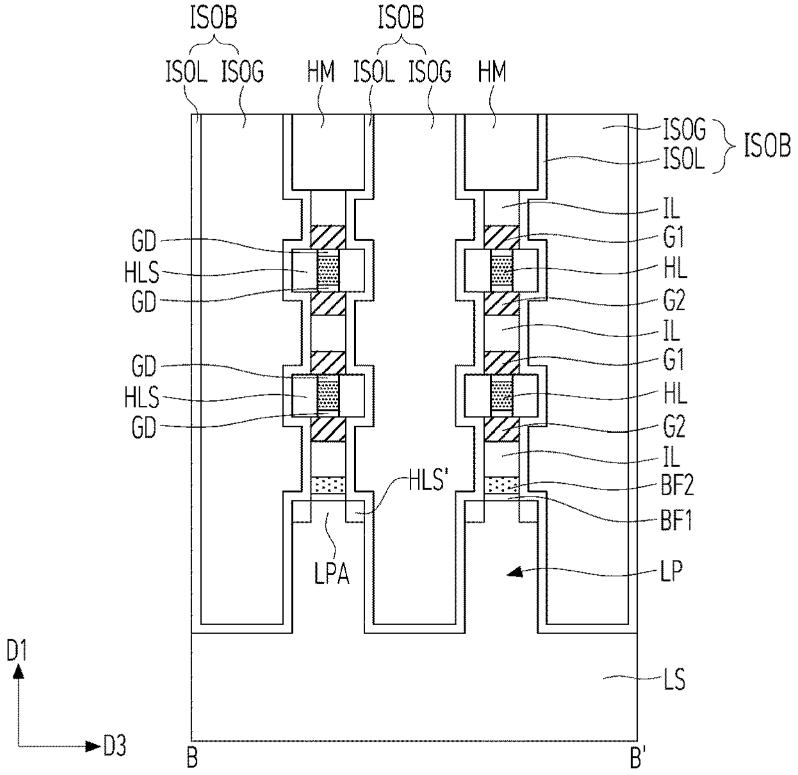
FIG. 3C is a cross-sectional view taken along line B-B' in FIG. 2.
Figure 3D:
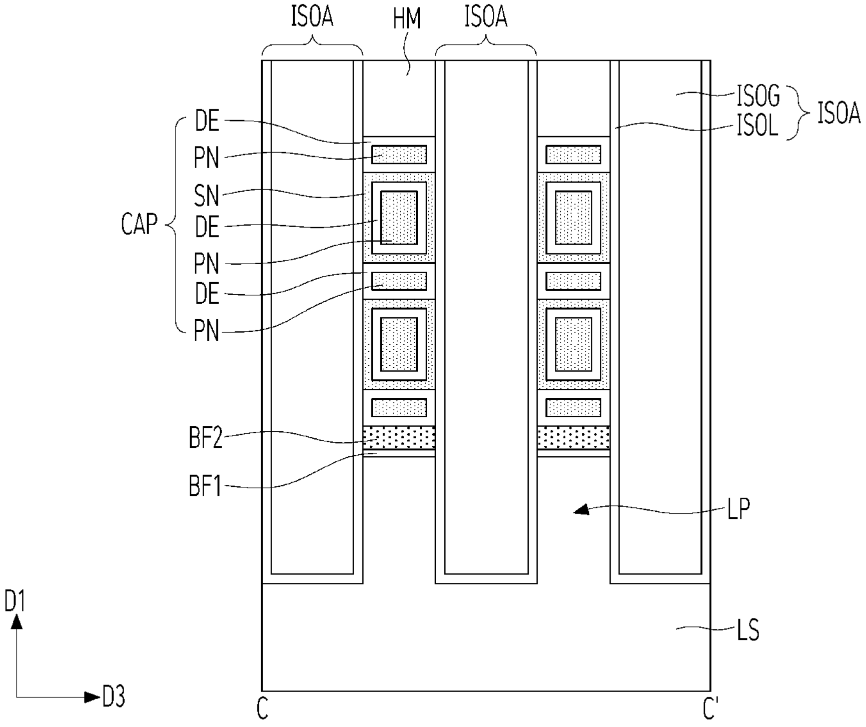
FIG. 3D is a cross-sectional view taken along line C-C' in FIG. 2.

FIG. 2 is a simplified schematic plan view of a semiconductor device according to an embodiment of the present disclosure. FIG. 3A is a simplified schematic perspective view of a first memory cell array MCA1 illustrated in FIG. 2. FIG. 3B is a cross-sectional view taken along line A-A' in FIG. 2. FIG. 3C is a cross-sectional view taken along line B-B' in FIG. 2. FIG. 3D is a cross-sectional view taken along line C-C' in FIG. 2.

Referring to FIGS. 2, 3A, 3B, 3C, and 3D, the semiconductor device 100 includes the memory cell array MCA including a plurality of memory cells MC. Reference may be made to FIGS. 1A to 1C for each of the memory cells MC. Each of the memory cells MC may include a first conductive line BL, a switching element TR, and a data storage element CAP.

The memory cell array MCA may include a three-dimensional (3-D) array of the memory cells MC including a column array of the memory cells MC and a row array of the memory cells MC. The plurality of memory cells MC may be stacked in a first direction D1 in the column array of the memory cells MC. The plurality of memory cells MC may be horizontally disposed in a second direction D2 and a third direction D3 in the row array of the memory cells MC. The memory cell array MCA may include sub-memory cell arrays MCA1 that are adjacent to each other in a second direction D2. The sub-memory cell array MCA1 may have a mirror-shaped structure in which two memory cells MC share a first conductive line BL. In another embodiment, the semiconductor device 100 may further include sub-memory cell arrays having a mirror-shaped structure in which two memory cells MC share the second electrode PN of a data storage element CAP. The memory cell array MCA may include a plurality of sub-memory cell arrays MCA1 in each of which the memory cells MC have been vertically stacked in the first direction D1. The memory cell array MCA may include the plurality of sub-memory cell arrays MCA1 that are horizontally arranged in a third direction D3.

In another embodiment, a plurality of sub-memory cell arrays MCA1 may be disposed in the second direction D2 in the memory cell array MCA. For example, a data storage element CAP, a switching element TR, a first conductive line BL, and a switching element TR may be sequentially disposed in an alternating manner in the second direction D2.

An inter-cell dielectric layer IL may be disposed between each pair of the memory cells MC that have been stacked in the first direction D1. The inter-cell dielectric layers IL may, for example, include silicon oxide. The inter-cell dielectric layers IL may also be referred to as a horizontal inter-cell dielectric layer. A hard mask HM may be disposed on the highest-level inter-cell dielectric layer IL. (See FIG. 3C).

Cell isolation layers ISOA and ISOB may be disposed between the memory cells MC that are adjacent to each other in the third direction D3. The cell isolation layers ISOA and ISOB may each also be referred to as a vertical inter-cell dielectric layer. The cell isolation layers ISOA and ISOB may, for example, each include silicon oxide, silicon carbon oxide (SiCO), silicon nitride, or any combination thereof. The cell isolation layers ISOA and ISOB may include first cell isolation layers ISOA and second cell isolation layers ISOB. The first cell isolation layers ISOA and the second cell isolation layers ISOB may vertically extend in the first direction D1. The first cell isolation layers ISOA and the second cell isolation layers ISOB may each have a pillar structure vertically extending in the first direction D1. The first cell isolation layers ISOA and the second cell isolation layers ISOB may be alternately repeated and disposed in the second direction D2. The first cell isolation layers ISOA may be disposed between the data storage elements CAP in the third direction D3. The second cell isolation layers ISOB may be disposed between the first conductive lines BL in the third direction D3. Second conductive lines DWL may be disposed between the first cell isolation layers ISOA and the second cell isolation layers ISOB in the second direction D2. The first cell isolation layers ISOA and the second cell isolation layers ISOB may each include a stack of a cell isolation liner layer ISOL and a cell isolation gap-fill layer ISOG. The cell isolation liner layers ISOL may each include silicon oxide. The cell isolation gap-fill layers ISOG may each include silicon carbon oxide.

The memory cell array MCA may be disposed over a lower structure LS.

The memory cell array MCA may include a plurality of second conductive lines DWL vertically stacked in the first direction D1. The memory cell array MCA may also include a plurality of horizontal layers HL that are vertically stacked in the first direction D1. The memory cell array MCA may further include a plurality of data storage elements CAP that are vertically stacked in the first direction D1. The memory cell array MCA may further include a plurality of first conductive lines BL that are spaced apart from each other in the third direction D3.

The second conductive lines DWL may each include a channel overlapping portion WLP and channel non-overlapping portions NOL, such as those illustrated in FIG. 1C. The channel overlapping portion WLP may have a cross shape. In an embodiment (not shown), the channel overlapping portion may have a diamond shape. The channel overlapping portion WLP may fully overlap a channel CH. The second conductive line DWL extending in the third direction D3 may include a plurality of channel overlapping portions WLP. The second conductive line DWL may have a notch-shaped sidewall because the channel overlapping portions WLP and the channel non-overlapping portions NOL are alternately repeated in the third direction D3.

A protection layer structure may be disposed between the lowest second conductive line DWL, among the plurality of second conductive lines DWL, and the lower structure LS. The protection layer structure may include a stack of a first protection layer BF1 and a second protection layer BF2. The first protection layer BF1 may be thinner than the second protection layer BF2. The first protection layer BF1 may cover the entire surface of the lower structure LS. The first and second protection layers BF1 and BF2 may be disposed between the first conductive line BL and the lower structure LS. The first and second protection layers BF1 and BF2 may be disposed between the data storage elements CAP and the lower structure LS. The first conductive line BL and the data storage elements CAP may be electrically separated from the lower structure LS by the first and second protection layers BF1 and BF2. The first and second protection layers BF1 and BF2 may be denoted as bottom dielectric layers or bottom passivation layers. The first and second protection layers BF1 and BF2 may each include a dielectric material, such as silicon oxide.

The lower structure LS may include the plurality of supporters LP. The supporters LP are parts of the lower structure LS, and may be structures for supporting the memory cell array MCA. The supporters LP and the lower structure LS may include the same material. The supporters LP may include thin protruding parts LPA. Protection layer level spacers HLS' may be formed on the sides of each of the thin protruding parts LPS. Referring to FIG. 3B, the horizontal orientation length of the horizontal layer HL in the second direction D3 may be smaller than the horizontal orientation length of the supporter LP. As illustrated in FIG. 3C, the horizontal orientation length of the horizontal layer HL in the third direction D3 may be less than the horizontal orientation length of the supporter LP.

The first conductive lines BL may vertically extend from the upper part of the lower structure LS in the first direction D1. The horizontal layers HL may extend in the second direction D2 that intersects the first direction D1. The second conductive lines DWL may extend in the third direction D3 that intersects the first direction D1 and the second direction D2.

From a top view, the horizontal layers HL may have a cross shape as illustrated, or in another embodiment (not shown) may have a diamond shape. In another embodiment, the sides of the horizontal layer HL may have a bent shape or a rounded (also referred to as a curved) shape. As illustrated in FIG. 1B, the horizontal layer HL may include a channel CH, a first doped region SR between the channel CH and the first conductive line BL, and a second doped region DR between the channel CH and the data storage element CAP. Referring back to FIG. 3C, horizontal layer level spacers HLS may be formed on the sides of the horizontal layers HL. The horizontal layer level spacer HLS may each include a dielectric material such as silicon oxide. The protection layer level spacers HLS' and the horizontal layer level spacers HLS may include the same material.

A first capping layer BC may be disposed between the second conductive line DWL and the first conductive line BL. A second capping layer CC may be disposed between the second conductive line DWL and a first electrode SN of the data storage element CAP. The first capping layer BC may be disposed between an upper horizontal line G1 and the first conductive line BL. Furthermore, the first capping layer BC may be disposed between a lower horizontal line G2 and the first conductive line BL. The second capping layer CC may be disposed between the upper horizontal line G1 and the first electrode SN of the data storage element CAP. Furthermore, the second capping layer CC may be disposed between the lower horizontal line G2 and the first electrode SN of the data storage element CAP. One memory cell MC may include a pair of first capping layers BC and a pair of second capping layers CC.

The first and second capping layers BC and CC may each include a dielectric material including, for example, silicon oxide, silicon nitride, silicon carbon oxide, air gap, or any combination thereof. In an embodiment, the first capping layer BC may include silicon oxide and the second capping layer CC may include a stack of silicon oxide and silicon nitride. In another embodiment, the first capping layer BC may include a stack of silicon oxide and silicon nitride.

The memory cell MC may further include a first contact node BLC and a second contact node SNC. The first contact node BLC may surround the outer wall of the first conductive line BL. The second contact node SNC may be disposed between the horizontal layer HL and the first electrode SN. The first contact node BLC may include a metal-based material or a semiconductor material. The second contact node SNC may include a metal-based material or a semiconductor material. For example, the first and second contact nodes BLC and SNC may each include titanium, titanium nitride, tungsten, or any combination thereof. Furthermore, the first and second contact nodes BLC and SNC may each include doped polysilicon. The first doped region SR and the second doped region DR may include impurities that have been diffused from the first and second contact nodes BLC and SNC, respectively.

Horizontal layers HL of the switching elements TR, which have been horizontally disposed in the third direction D3, may share one second conductive line DWL. The horizontal layers HL of the switching elements TR, which have been horizontally disposed in the third direction D3, may be connected to the first conductive lines BL that are different from each other. The switching elements TR that have been stacked in the first direction D1 may share one first conductive line BL. The switching elements TR that have been horizontally disposed in the third direction D3 may share one second conductive line DWL.

First cell isolation layers ISOA may be disposed between the first electrodes SN of the data storage elements CAP in the third direction D3 for isolating the first electrodes SN from each other. Second electrodes PN of the data storage elements CAP may be connected to a common plate PL.

The lower structure LS may include a semiconductor substrate, a metal line structure, a dielectric structure, a conductive structure, a bond pad structure, another type of memory, or a peripheral circuit unit.

For example, the lower structure LS may include a structure in which a peripheral circuit unit, a metal line structure, and a bond pad structure have been sequentially stacked. The memory cell array MCA and the peripheral circuit unit of the lower structure LS may be combined by wafer bonding.

The peripheral circuit unit of the lower structure LS may be disposed at a lower level than the memory cell array MCA, which may also be referred to as a cell over peri (COP) structure. The peripheral circuit unit may include at least one control circuit for driving the memory cell array MCA. The at least one control circuit of the peripheral circuit unit may include an N-channel transistor, a P-channel transistor, a CMOS circuit, or any combination thereof. The at least one control circuit of the peripheral circuit unit may include an address decoder circuit, a read circuit, and a write circuit. The at least one control circuit of the peripheral circuit unit may include a planar channel transistor, a recess channel transistor, a buried gate transistor, and a fin channel transistor (FinFET).

For example, the peripheral circuit unit may include sub-word line drivers and a sense amplifier. The first conductive line BL may be connected to the sense amplifier. The second conductive lines DWL may be connected to the sub-word line drivers.

In another embodiment, the peripheral circuit unit may be disposed at a higher level than the memory cell array MCA, which may also be referred to as peri over cell (POC) structure. In this case, the lower structure LS may include a first semiconductor substrate. The peripheral circuit unit may include a second semiconductor substrate.

In another embodiment, the memory cell array MCA may include a DRAM, an embedded DRAM, a NAND, a FeRAM, a STTRAM, a PCRAM, or a ReRAM.

In another embodiment, the individual memory cell MC may be substituted with the memory cell MC1 of FIG. 1D.

FIGS. 4A to 4C, 5A and 5B, 6, 7A to 7C, 8A to 8C, 9A and 9B, 10A and 10B, 11A and 11B, 12A and 12B, 13A and 13B, 14, 15A to 15D, 16A and 16B, 17A and 17B, 18A and 18B, 19A and 19B, 20A and 20B, 21A and 21B, 22A and 22B, 23A and 23B, and 24A and 24B are diagrams illustrating a method of manufacturing a semiconductor device according to an embodiment of the present disclosure.

Figure 4A:
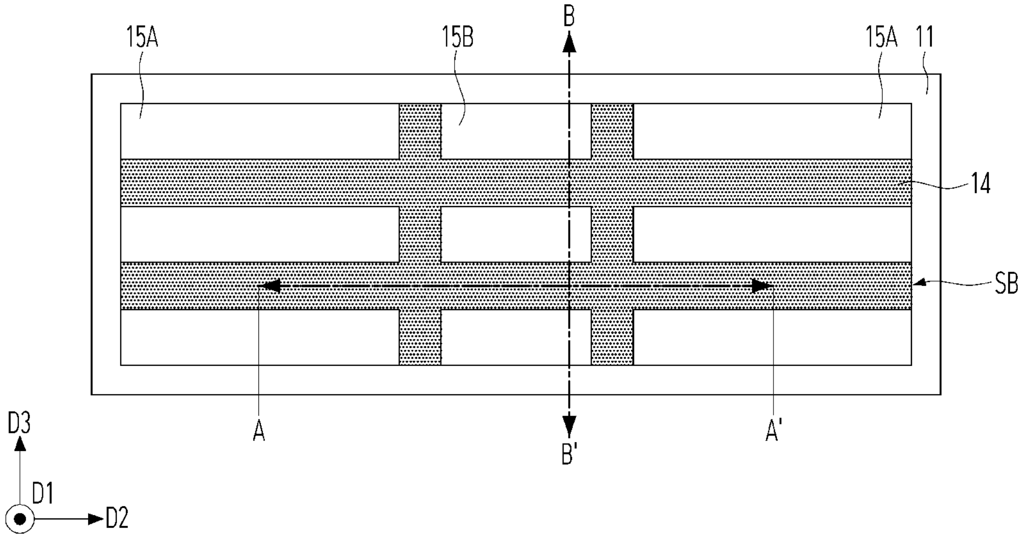
FIGS. 4A to 4C, 5A and 5B, 6A and 6B, 7A to 7C, 8A to 8C, 9A and 9B, 10A and 10B, 11A and 11B, 12A and 12B, 13A and 13B, 14, 15A to 15D, 16A and 16B, 17A and 17B, 18A and 18B, 19A and 19B, 20A and 20B, 21A and 21B, 22A and 22B, 23A and 23B, and 24A and 24B are diagrams illustrating a method of manufacturing a semiconductor device according to an embodiment of the present disclosure.
Figure 4B:
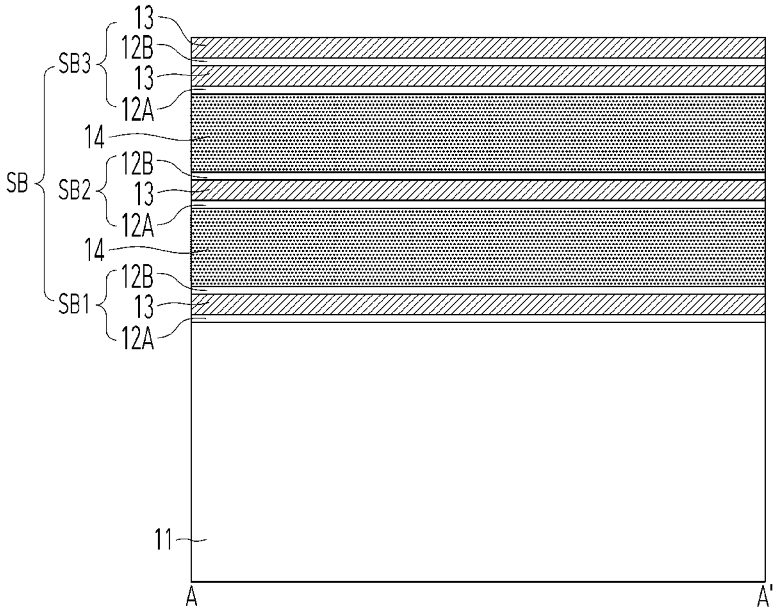
Figure 4C:
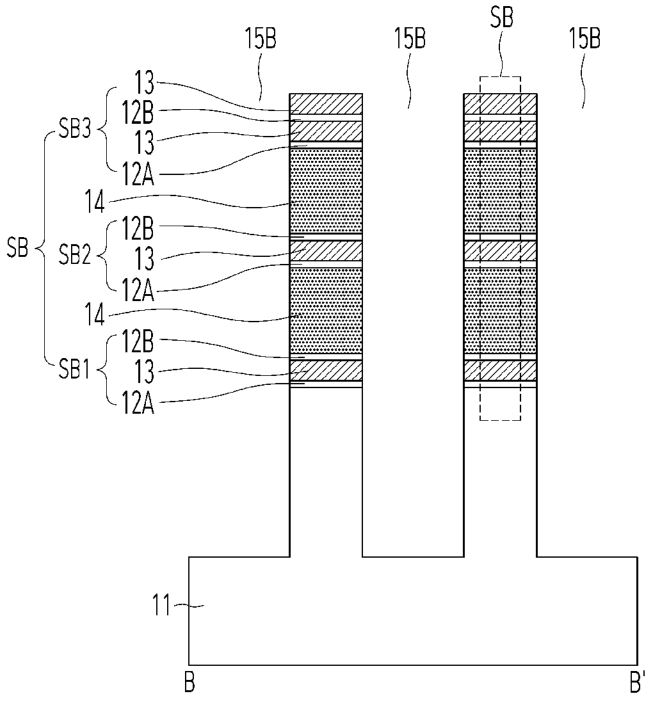

FIG. 4A is a plan view of the level of a fourth layer 14 illustrating a method of forming a stack body SB and sacrificial isolation openings 15A and 15B. FIG. 4B is a cross-sectional view taken along line A-A' in FIG. 4A. FIG. 4C is a cross-sectional view taken along line B-B' in FIG. 4A.

As illustrated in FIGS. 4A to 4C, the stack body SB may be formed on a lower structure 11. The lower structure 11 may be a material suitable for semiconductor processing including at least one of a conductive material, a dielectric material, and a semiconductor material. Various materials may be formed on the lower structure 11. The lower structure 11 may include a semiconductor substrate. For example, the lower structure 11 may be made of a material containing silicon. The lower structure 11 may include silicon, single crystalline silicon, polysilicon, amorphous silicon, silicon germanium, single crystalline silicon germanium, polycrystalline silicon germanium, carbon-doped silicon, or any combination thereof or a multi-layer of them. The lower structure 11 may also include another semiconductor material, such as germanium. The lower structure 11 may also include a compound semiconductor substrate, such as a III/V group semiconductor substrate, for example, GaAs. The lower structure 11 may also include a silicon on insulator (SOI) substrate.

A plurality of sub-stacks may be alternately stacked on the stack body SB. A first layer 12A, a second layer 13, a third layer 12B, and the fourth layer 14 may be stacked in order on each of the sub-stacks. The first layers 12A and the third layers 12B may include the same material, and may include silicon germanium or single crystalline silicon germanium. The second layers 13 and the fourth layers 14 may include the same material, and may include single crystalline silicon. The first layers 12A, the second layers 13, the third layers 12B, and the fourth layers 14 may be formed by epitaxial growth. The first layer 12A at the lowest level of the stack body SB may play a role as a seed layer during an epitaxial growth process. The first layer 12A may be thinner than the second layer 13. The fourth layer 14 may be thicker than the second layer 13.

In the present embodiment, the stack body SB may include a plurality of fourth layers 14, a first stack SB1, a second stack SB2, and a third stack SB3. The first stack SB1, the fourth layer 14, the second stack SB2, the fourth layer 14, and the third stack SB3 may, for example, be stacked in the recited order in the stack body SB. The first stack SB1, the second stack SB2, and the third stack SB3 may each include a tri-layer stack of the first layer 12A, the second layer 13, and the third layer 12B. For example, if the first layers 12A and the third layers 12B each include a silicon germanium layer and the second layers 13 each include a single crystalline silicon layer, the first stack SB1, the second stack SB2, and the third stack SB3 may each include a first silicon germanium/single crystalline silicon/second silicon germanium (SiGe/Si/SiGe) stack. The third stack SB3 may further include a second layer 13 on the tri-layer stack of the first layer 12A, second layer 13, and the third layer 12B.

The second layers 13 may include a first single crystalline silicon layer. The fourth layers 14 may include a second single crystalline silicon layer. The second single crystalline silicon layer may be thicker than the first single crystalline silicon layer. Accordingly, in the stack body SB, the first stack SB1 may be disposed under the second single crystalline silicon layers, and the second stack SB2 may be disposed over the second single crystalline silicon layer. The first and second stacks SB1 and SB2 may each include the tri-layer stack of the first silicon germanium layer/first single crystalline silicon layer/second silicon germanium layer. The second single crystalline silicon layer may be thicker than the first single crystalline silicon layer.

The first layers 12A, the second layers 13, and the third layers 12B may also be referred to as "sacrificial layers". The fourth layers 14 may also be referred to as recess target layers.

The stack body SB may also be referred to as a vertical stack. A plurality of sacrificial layers and a plurality of recess target layers may be alternately formed on the stack body SB. The sacrificial layers may include the first stack SB1, the second stack SB2, and the third stack SB3. The first stack SB1, the second stack SB2, and the third stack SB3 may each include the tri-layer stack of the first layer 12A, second layer 13, and the third layer 12B. The recess target layers may include the fourth layers 14. The sacrificial layers may each include the tri-layer stack of the first silicon germanium layer/first single crystalline silicon layer/second silicon germanium layer. The recess target layers may each include a single layer of a second single crystalline silicon layer. The second single crystalline silicon layer may be thicker than the first single crystalline silicon layer.

As illustrated in FIGS. 2 to 3D, if the memory cells MC are vertically stacked, the first stack SB1, the fourth layer 14, the second stack SB2, the fourth layer 14, and the third stack SB3 may be alternately stacked several times.

Next, as shown in FIG. 4A, a plurality of sacrificial isolation openings 15A and 15B may be formed by etching parts of the stack body SB. The sacrificial isolation openings 15A and 15B are initial openings for cell isolation, and may include large openings 15A and small openings 15B. The size of each of the large openings 15A may be greater than the size of each of the small opening 15B. From a top view, the large openings 15A and the small openings 15B may each have a rectangular shape. However, the invention is not limited in this way. For example, in another embodiment, the large openings 15A and the small openings 15B may each have a circular shape or an elliptical shape. In another embodiment, the sacrificial isolation openings 15A and 15B may be sacrificial isolation trenches. The large openings 15A and the small openings 15B may vertically extend in a first direction D1. The large openings 15A and the small openings 15B may be alternately disposed in a second direction D2. The plurality of the large openings 15A may be disposed in a third direction D3. The plurality of the small openings 15B may be disposed in the third direction D3. The large openings 15A and the small openings 15B may penetrate the stack body SB in the first direction D1.

After the sacrificial isolation openings 15A and 15B are formed, parts of the lower structure 11, which have been exposed under the sacrificial isolation openings 15A and 15B, may be etched. Accordingly, the bottoms of the sacrificial isolation openings 15A and 15B may extend into the lower structure 11. The bottoms of the sacrificial isolation openings 15A and 15B may each include a U-shaped profile. The fourth layers 14 may have mesh-shaped patterns by the sacrificial isolation openings 15A and 15B.

Figure 5A:
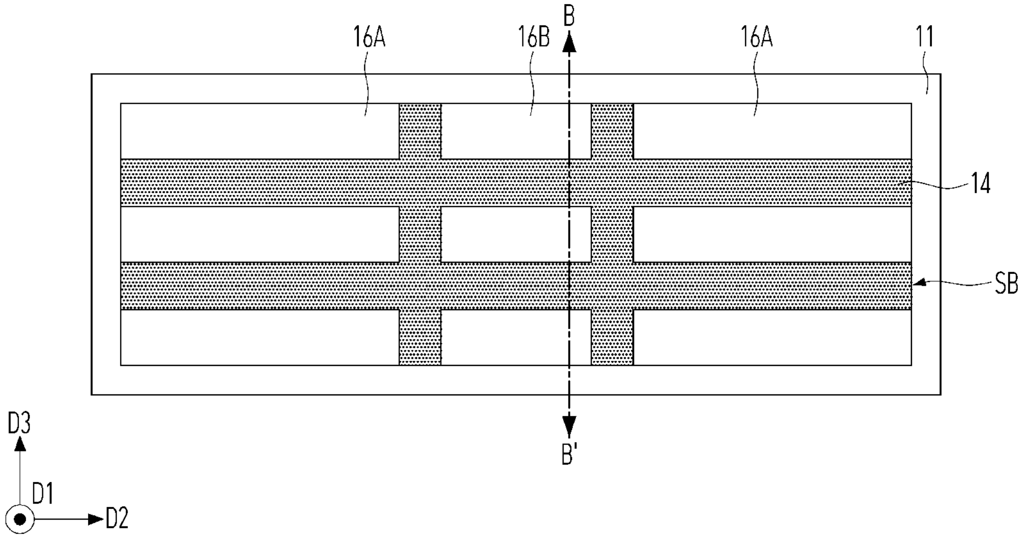
Figure 5B:
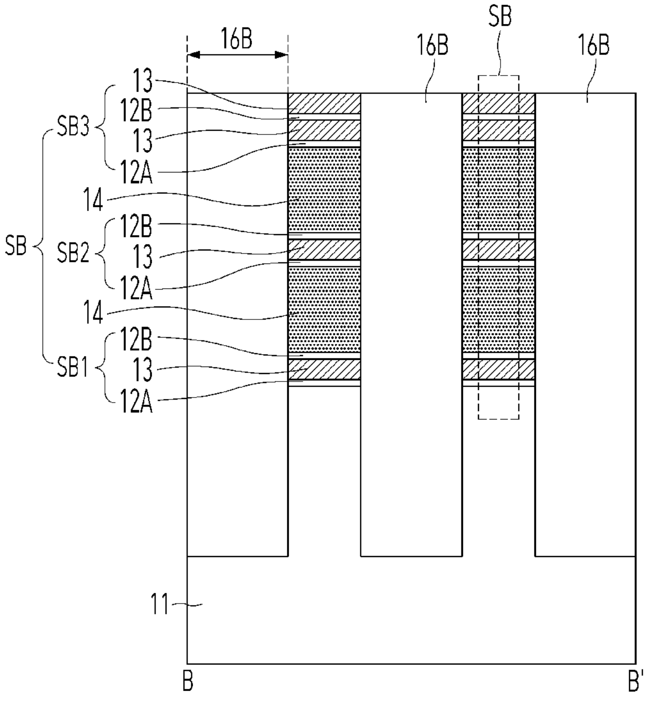

FIG. 5A is a plan view of the level of the fourth layer 14 illustrating a method of forming sacrificial isolation layers 16A and 16B. FIG. 5B is a cross-sectional view taken along line B-B' in FIG. 5A.

As illustrated in FIGS. 5A and 5B, the sacrificial isolation layers 16A and 16B that fill the sacrificial isolation openings 15A and 15B may be formed. The sacrificial isolation layers 16A and 16B may include first sacrificial isolation layers 16A and second sacrificial isolation layers 16B. The first sacrificial isolation layers 16A may fill the large openings 15A, respectively. The second sacrificial isolation layers 16B may fill the small openings 15B, respectively.

The first sacrificial isolation layers 16A and the second sacrificial isolation layers 16B may include the same material. The first sacrificial isolation layers 16A and the second sacrificial isolation layers 16B may be formed of a dielectric material. Forming the first sacrificial isolation layers 16A and the second sacrificial isolation layers 16B may include forming sacrificial isolation materials on the stack body SB in order to fill the sacrificial isolation openings 15A and 15B and planarizing sacrificial isolation materials so that the highest layer of the stack body SB is exposed. The first sacrificial isolation layers 16A and the second sacrificial isolation layers 16B may have different sizes or different volumes. For example, the size (or volume) of each of the first sacrificial cell isolation layers 16A may be greater than that of each of the second sacrificial isolation layers 16B. The lengths of the first sacrificial isolation layers 16A and the second sacrificial isolation layers 16B in the third direction D3 may be the same. The lengths of the first sacrificial isolation layers 16A and the second sacrificial isolation layers 16B in the second direction D2 may be different from each other. The length of the first sacrificial isolation layer 16A in the second direction D2 may be greater than the length of the second sacrificial isolation layer 16B.

The first sacrificial isolation layers 16A and the second sacrificial isolation layers 16B may vertically extend in the first direction D1. The first sacrificial isolation layers 16A and the second sacrificial isolation layers 16B may be alternately disposed in the second direction D2. The plurality of first sacrificial isolation layers 16A may be disposed in the third direction D3. The plurality of second sacrificial isolation layers 16B may be disposed in the third direction D3. The first sacrificial isolation layers 16A and the second sacrificial isolation layers 16B may penetrate the stack body SB in the first direction D1.

The first sacrificial isolation layers 16A and the second sacrificial isolation layers 16B may include the same material. The first sacrificial isolation layers 16A and the second sacrificial isolation layers 16B may be formed of a dielectric material. For example, the first sacrificial isolation layers 16A and the second sacrificial isolation layers 16B may include silicon oxide, silicon nitride, silicon carbon oxide, silicon carbon nitride, or any combination thereof.

Figure 6A:
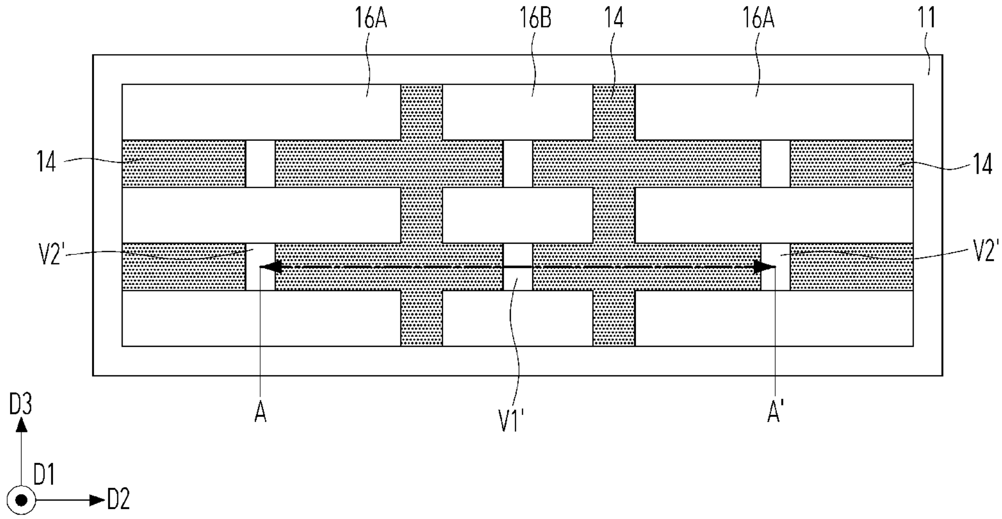
Figure 6B:
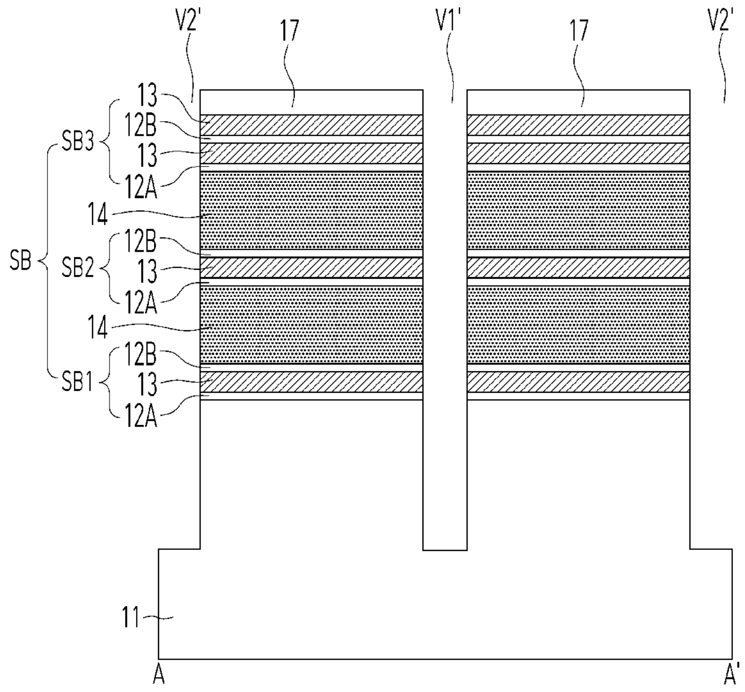

FIG. 6A is a plan view of the level of the fourth layer 14 illustrating a method of forming sacrificial vertical openings V1' and V2'. FIG. 6B is a cross-sectional view taken along line A-A' in FIG. 6A.

As illustrated in FIGS. 6A and 6B, a hard mask layer pattern 17 may be formed on the stack body SB, the first sacrificial isolation layers 16A, and the second sacrificial isolation layers 16B. The hard mask layer pattern 17 may include silicon nitride. The hard mask layer pattern 17 may be formed by etching using a mask layer and may define a plurality of hole-shaped openings.

Next, parts of the stack body SB may be etched by using the hard mask layer pattern 17 as an etch barrier to form a plurality of sacrificial vertical openings V1' and V2' in the stack body SB. The sacrificial vertical openings V1' and V2' may include first sacrificial vertical openings V1' and second sacrificial vertical openings V2'. The first and second sacrificial vertical openings V1' may be hole-shaped openings. The first and second sacrificial vertical openings V1' and V2' may vertically extend in the first direction D1. The first and second sacrificial vertical openings V1' and V2' may be formed by etching the stack body SB between the first and second sacrificial isolation layers 16A and 16B. The first sacrificial vertical openings V1' may be formed by etching the stack body SB between the second sacrificial isolation layers 16B. The second sacrificial vertical openings V2' may be formed by etching the stack body SB between the first sacrificial isolation layers 16A. The first sacrificial vertical openings V1' may be disposed between the second sacrificial isolation layers 16B in the third direction D3. The second sacrificial vertical openings V2' may be disposed between the first sacrificial isolation layers 16A in the third direction D3. From a top view, a cross section of each of the first and second sacrificial vertical openings V1' and V2' may be a rectangle, a circle, or an oval.

Figure 7A:
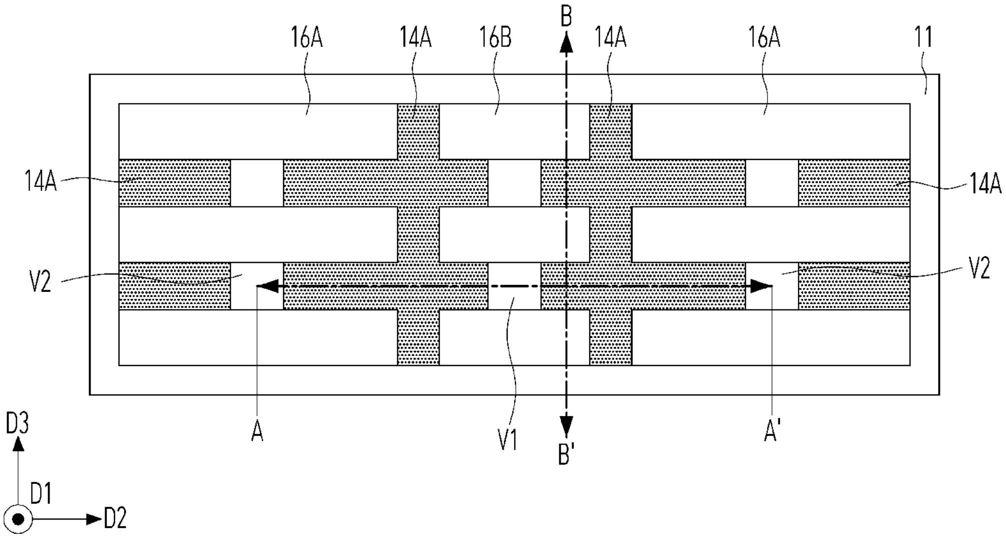
Figure 7B:
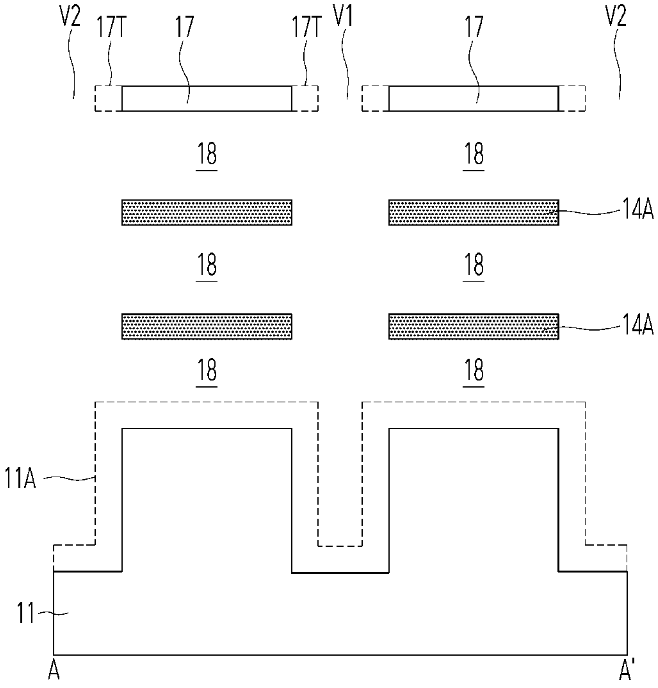
Figure 7C:
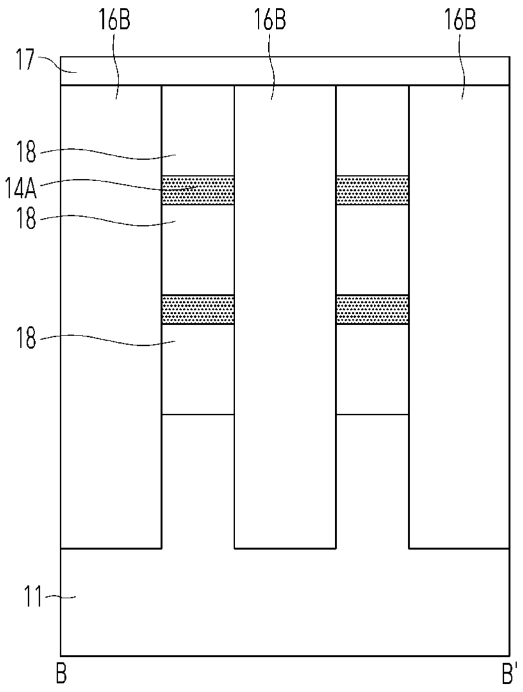

FIG. 7A is a plan view illustrating a method of forming a preliminary horizontal layer 14A. FIG. 7B is a cross-sectional view taken along line A-A' in FIG. 7A. FIG. 7C is a cross-sectional view taken along line B-B' in FIG. 7A.

As illustrated in FIGS. 7A to 7C, a part of the hard mask layer pattern 17 may be trimmed (refer to reference numeral 17T).

Next, the first and third layers 12A and 12B may be selectively removed through the first and second sacrificial vertical openings V1' and V2'. In order to selectively remove the first layers 12A and the third layers 12B, a difference between the etch selectivities of the second and fourth layers 13 and 14 and the first and third layers 12A and 12B may be used. The first layers 12A and the third layers 12B may be removed by using wet etching or dry etching. For example, if the first layers 12A and the third layers 12B each include a silicon germanium layer and the second layers 13 and the fourth layers 14 each include a single crystalline silicon layer, the silicon germanium layers may be etched by using an etchant or an etch gas having selectivity to the single crystalline silicon layers.

Next, the second and fourth layers 13 and 14 may be recessed. In order to recess the second layers 13 and the fourth layers 14, wet etching or dry etching may be used. In an embodiment, the fourth layers 14 may be partially etched while the second layers 13 are removed. Accordingly, the second layers 13 may be removed, and the fourth layers 14 may become thin as indicated by reference numeral "14A". A recess process for forming the thinned fourth layer 14A, that is, preliminary horizontal layers 14A, may also be referred to as a thinning process or trimming process of the fourth layers 14. In order to form the preliminary horizontal layers 14A, upper surfaces, lower surfaces, and sides of the fourth layers 14 may be recessed. The preliminary horizontal layers 14A may each also be referred to as a thin body active layer. The preliminary horizontal layers 14A may each include a single crystalline silicon layer. For example, hot SC-1 (HSC1) may be used in the recess process for forming the preliminary horizontal layers 14A. HSC1 may include a solution in which ammonium hydroxide ($NH_4OH$), hydrogen peroxide ($H_2O_2$), and water ($H_2O$) are mixed at the ratio of 1:4:20, respectively. The second layers 13 and the fourth layers 14 may be selectively etched by using such HSC1.

The preliminary horizontal layers 14A may be formed by the recess process for the fourth layers 14 with horizontal-shaped recesses 18 disposed between the preliminary horizontal layers 14A. Upper and lower surfaces of the preliminary horizontal layers 14A may be flat surfaces.

From a top view, the preliminary horizontal layers 14A may each have a cross shape. The sides of the preliminary horizontal layers 14A may each have a bent shape or a rounded shape.

After the preliminary horizontal layers 14A are formed, the first and second sacrificial vertical openings may be extended as indicated by reference numerals V1 and V2. The preliminary horizontal layers 14A may be isolated from each other in the second direction D2 by the first and second sacrificial vertical openings V1 and V2. The preliminary horizontal layers 14A may each have a shape in which a plurality of cross shapes has been merged in the third direction D3.

While the preliminary horizontal layers 14A are formed, a surface of the lower structure 11 may be recessed at a predetermined depth (refer to reference numeral "11A"). Accordingly, the depths of the first and second sacrificial vertical openings V1' and V2' may be increased.

The first sacrificial vertical openings V1 and the second sacrificial vertical openings V2 may be alternately disposed between the preliminary horizontal layers 14A in the second direction D2. The first sacrificial vertical openings V1 may be disposed between the second sacrificial isolation layers 16B in the third direction D3. The second sacrificial vertical openings V2 may be disposed between the first sacrificial isolation layers 16A in the third direction D3.

Figure 8A:
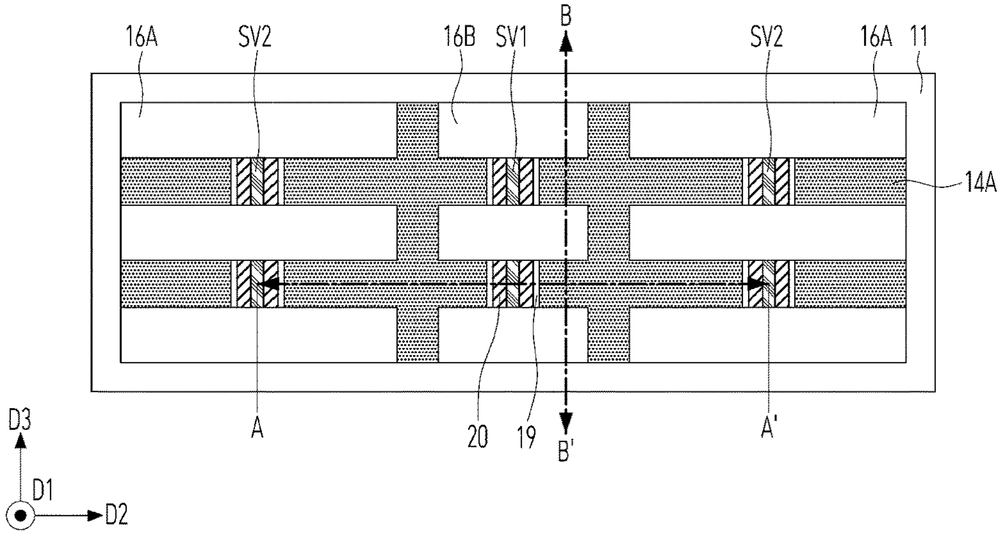
Figure 8B:
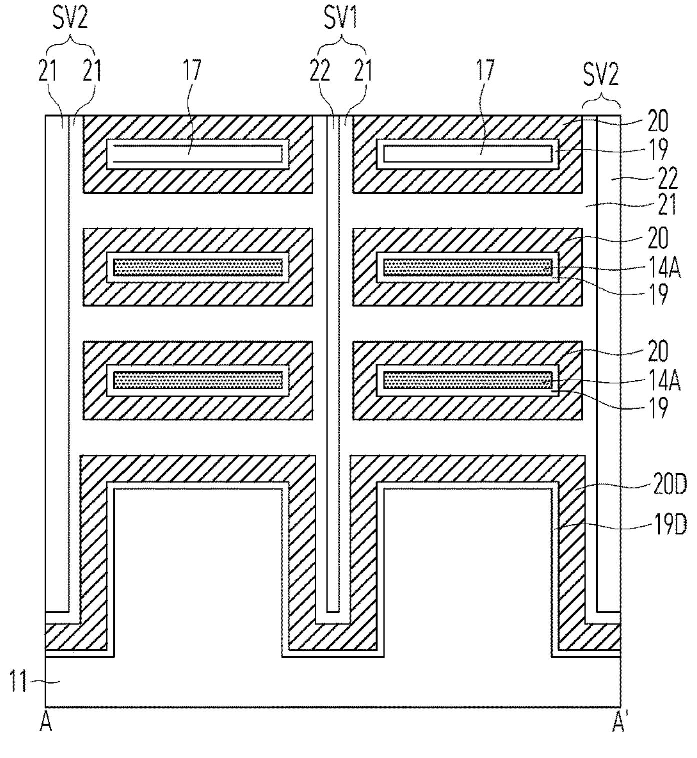
Figure 8C:
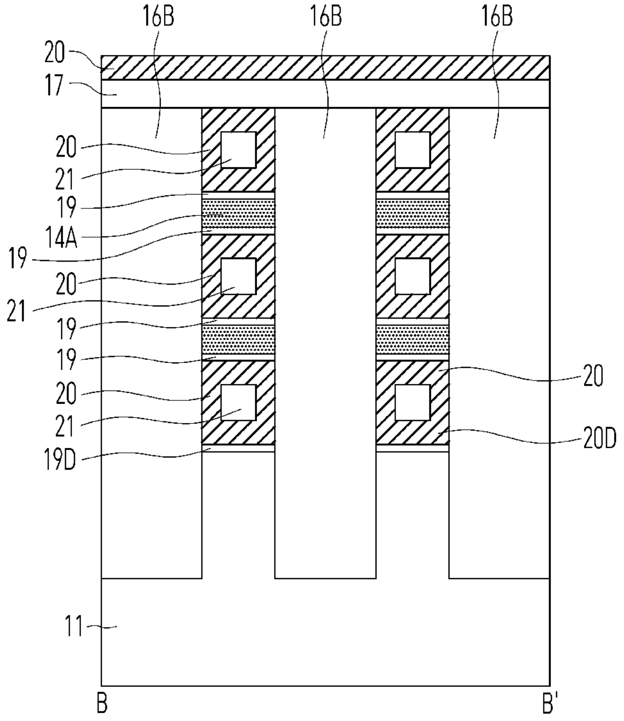

FIG. 8A is a plan view illustrating a method of forming an inter-level dielectric layer 19 and a horizontal conductive layer 20. FIG. 8B is a cross-sectional view taken along line A-A' in FIG. 8A. FIG. 8C is a cross-sectional view taken along line B-B' in FIG. 8A.

As illustrated in FIGS. 8A to 8C, the inter-level dielectric layers 19 that fully cover or surround the preliminary horizontal layers 14A may be formed. The inter-level dielectric layer 19 may also be referred to as a gate dielectric layer. The inter-level dielectric layer 19 may also be referred to as a horizontal layer-side dielectric layer. The inter-level dielectric layer 19 may include silicon oxide, silicon nitride, metal oxide, metal oxynitride, metal silicate, a high-k material, a ferroelectric material, an anti-ferroelectric material, or any combination thereof. The inter-level dielectric layer 19 may include $SiO_2$, $Si_3N_4$, $HfO_2$, $Al_2O_3$, $ZrO_2$, AlON, HfON, HfSiO, HfSiON, HfZrO, or any combination thereof.

The inter-level dielectric layers 19 may be formed by oxidizing the surfaces of the preliminary horizontal layers 14A. In another embodiment, the inter-level dielectric layer 19 may be formed by a process of depositing silicon oxide.

While the inter-level dielectric layer 19 is formed, a first protection layer 19D may be formed on a surface of the lower structure 11. The inter-level dielectric layer 19 and the first protection layer 19D may include the same material.

The horizontal conductive layer 20 may be formed on the inter-level dielectric layers 19. The horizontal conductive layer 20 may include a metal-based material, a semiconductor material, or any combination thereof. The horizontal conductive layer 20 may include titanium nitride, tungsten, polysilicon, or any combination thereof. For example, the horizontal conductive layer 20 may include a TiN/W stack on which titanium nitride and tungsten have been sequentially stacked. The horizontal conductive layer 20 may include an N type work function material or a P type work function material. The N type work function material may have a low work function of 4.5 eV or less. The P type work function material may have a high work function of more than 4.5 eV. While the horizontal conductive layer 20 is formed, a dummy horizontal conductive layer 20D may be formed on the first protection layer 19D. The horizontal conductive layer 20 and the dummy horizontal conductive layer 20D may include the same material.

An inter-cell dielectric layer 21 may be formed on the horizontal conductive layers 20. The inter-cell dielectric layer 21 may be filled between the horizontal conductive layers 20 that are vertically adjacent to each other. The inter-cell dielectric layer 21 may include silicon oxide. Parts of the inter-cell dielectric layer 21 may be conformally formed on surfaces of the first and second sacrificial vertical openings V1 and V2. The horizontal-shaped recesses (18 in FIGS. 7B and 7C) may be filled by the horizontal conductive layer 20 and the inter-cell dielectric layer 21.

A sacrificial pillar 22 may be formed on the inter-cell dielectric layer 21 that is disposed in the first and second sacrificial vertical openings V1 and V2. The sacrificial pillar 22 may include amorphous carbon as a sacrificial material. In another embodiment, a pillar capping layer may be further formed on the sacrificial pillar 22. The pillar capping layer may include a metal-based material. The pillar capping layer may include titanium nitride. Forming the sacrificial pillar 22 may include depositing the sacrificial material and planarizing the sacrificial material. The planarization for forming the sacrificial pillar 21 may be performed until the highest-level horizontal conductive layer 20 is exposed. Subsequently, the highest-level inter-cell dielectric layer 21 may also be planarized until the highest-level horizontal conductive layer 20 is exposed. The sacrificial pillar 22 might not be formed between the horizontal conductive layers 20 that are vertically stacked.

The inter-cell dielectric layer 21 and the sacrificial pillar 22 may form first and second sacrificial pillar structures SV1 and SV2 that fill the first and second sacrificial vertical openings V1 and V2. The first sacrificial pillar structure SV1 may fill the first sacrificial vertical openings V1. The second sacrificial pillar structure SV2 may fill the second sacrificial vertical openings V2. In another embodiment, the first and second sacrificial pillar structures SV1 and SV2 may each include a dielectric material, a carbon-containing material, a metal-based material, or any combination thereof. In another embodiment, the first and second sacrificial pillar structures SV1 and SV2 may each include silicon oxide, silicon nitride, titanium nitride, amorphous carbon, or any combination thereof. From a top view, the first sacrificial pillar structure SV1 and the second sacrificial pillar structure SV2 may each be a hole-shaped sacrificial pillar.

Referring back to FIG. 8C, the horizontal conductive layers 20 may be formed between the preliminary horizontal layers 14A. The inter-cell dielectric layer 21 may be disposed within the horizontal conductive layers 20. The horizontal conductive layers 20 may surround the inter-cell dielectric layer 21. The horizontal conductive layers 20 may include a first surrounding part and a second surrounding part. In this case, the first surrounding part may surround the preliminary horizontal layers 14A in a direction A-A', and the second surrounding part may surround the inter-cell dielectric layer 21 in a direction B-B'.

The sub-stacks of the stack body SB may be substituted with cell molds by the series of processes illustrated in FIGS. 4A to 8C. The first layers 12A, the second layers 13, and the third layers 12B may be substituted with the horizontal conductive layers 20 and the inter-cell dielectric layer 21. The fourth layers 14 may become the preliminary horizontal layer 14A by the recess process. The horizontal conductive layers 20 may each also be referred to as a trimming target layer.

Figure 9A:
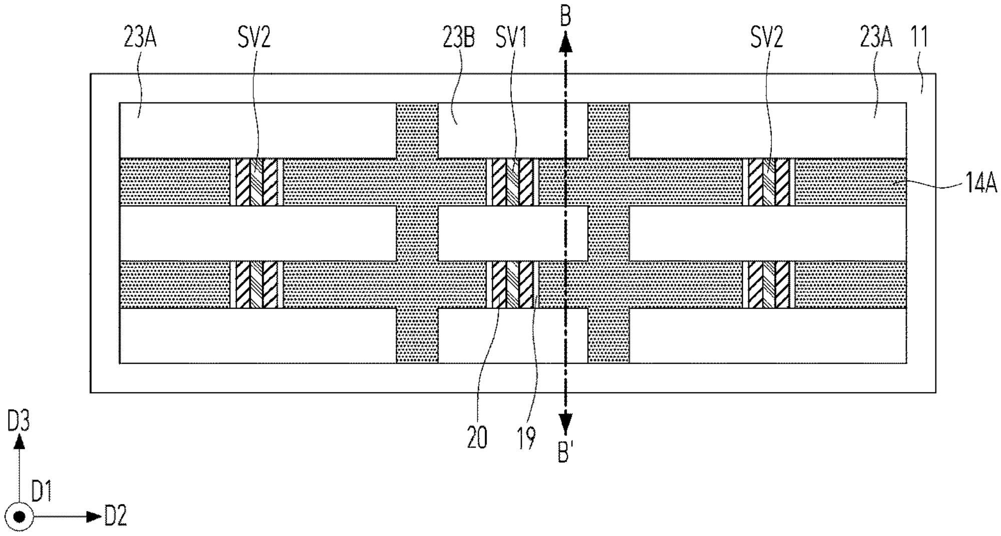
Figure 9B:
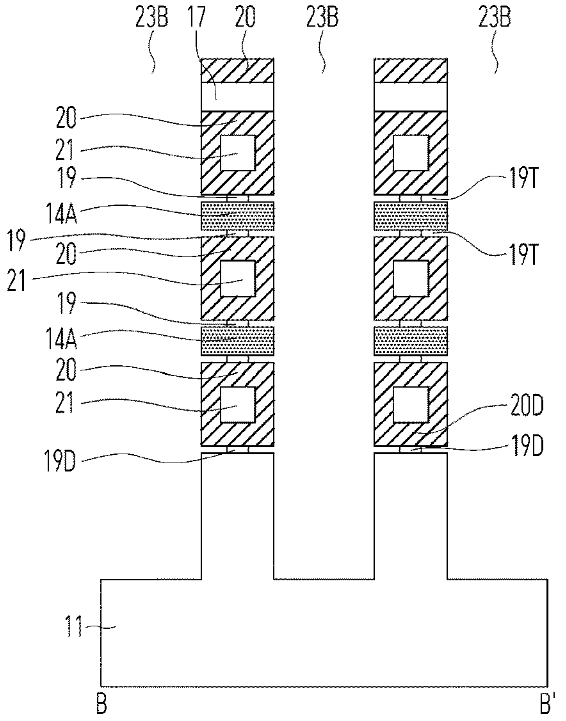

FIG. 9A is a plan view illustrating a method of forming cell isolation openings 23A and 23B. FIG. 9B is a cross-sectional view taken along line B-B' in FIG. 9A.

As illustrated in FIGS. 9A and 9B, in order to form the cell isolation openings 23A and 23B, the first and second sacrificial isolation layers 16A and 16B may be removed. While the first and second sacrificial isolation layers 16A and 16B are removed, the first and second sacrificial pillar structures SV1 and SV2 may be covered by the mask layer. The sides of the preliminary horizontal layers 14A and the horizontal conductive layers 20 may be exposed in a direction B-B' by the cell isolation openings 23A and 23B.

Subsequently, a first trimming process may be performed. For example, the inter-level dielectric layers 19 may be exposed by the first trimming process. The first trimming process may include trimming (19T) a part of the inter-level dielectric layers 19, which is exposed by the cell isolation openings 23A and 23B. The first trimming process may be horizontally performed in the third direction D3. Accordingly, the width of each of the inter-level dielectric layers 19 in the third direction D3 may be reduced. All the inter-level dielectric layers 19 may be removed in the second direction D2. The inter-level dielectric layers 19 may also be referred to as dielectric target layers. The horizontal conductive layers 20 may also be referred to as conductive target layers. The first trimming process may be horizontally performed between the cell isolation openings 23A and 23B in the second direction D2.

Figure 10A:
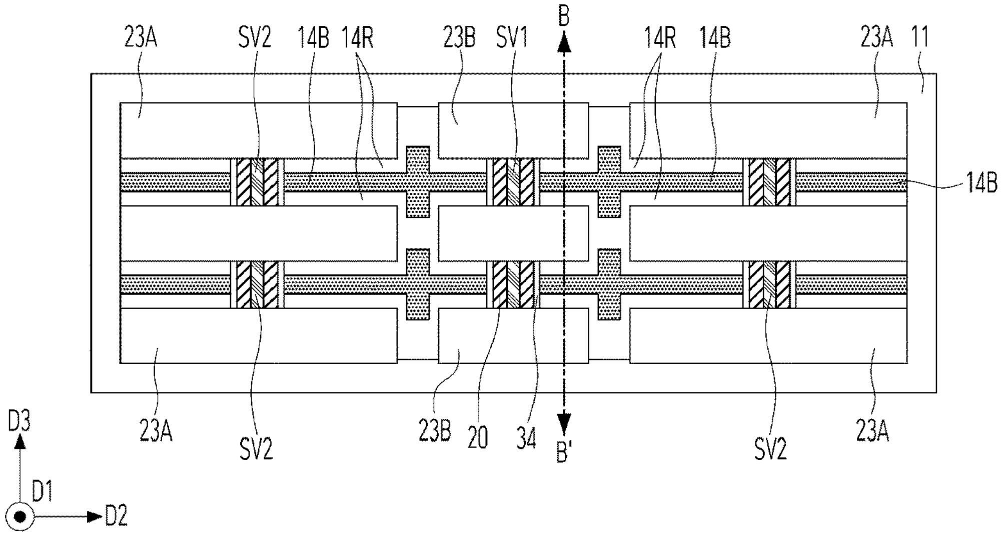
Figure 10B:
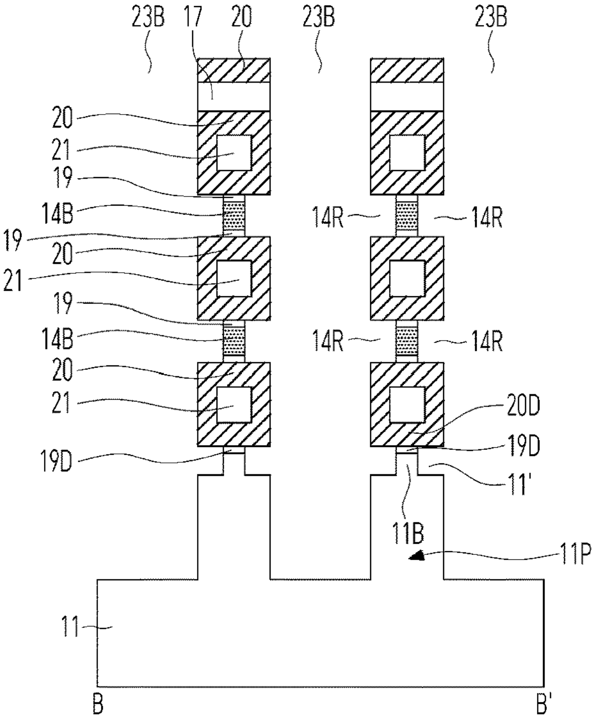

FIG. 10A is a plan view illustrating a second trimming process. FIG. 10B is a cross-sectional view taken along line B-B' in FIG. 10A.

As illustrated in FIGS. 10A and 10B, the preliminary horizontal layers 14A may be exposed to the second trimming process. The second trimming process may include trimming the sides of the preliminary horizontal layers 14A in the second direction D2 and the third direction D3 through the cell isolation openings 23A and 23B. The second trimming process may be horizontally performed in the second direction D2 and the third direction D3. Accordingly, the width of each of the preliminary horizontal layers 14A in the third direction D3 may be reduced. A horizontal layer level gap 14R may be formed on the sides of the trimmed preliminary horizontal layers, that is, the sides of the horizontal layers 14B. The horizontal layer level gap 14R may be disposed between the horizontal conductive layers 20 that are vertically adjacent to each other. The horizontal layers 14B may also be referred to as "trimmed horizontal layer patterns".

While the horizontal layers 14B are formed, a surface of the lower structure 11, for example, the bottoms of the cell isolation openings 23A and 23B may be extended.

After the second trimming process, the horizontal layers 14B may be formed in line B-B'. All preliminary horizontal layers 14A may be removed between the cell isolation openings 23A and 23B that are adjacent to each other in the second direction D2. While the preliminary horizontal layers 14A are trimmed, a surface of the lower structure 11 may be partially recessed (refer to reference numeral 11'). Accordingly, a supporter 11P may be formed under the first protection layer 19D. The supporter 11P may include the thin protruding part 11B. The thin protruding part 11B may come in direct contact with the first protection layer 19D. The horizontal layer patterns 14B, the thin protruding part 11B, and the first protection layer 19D may have the same line width in the third direction D3.

The horizontal layers 14B may be disposed between the first and second sacrificial pillar structures SV1 and SV2 in the second direction D2. From a top view, the horizontal layers 14B may each have a cross shape. The horizontal layers 14B may each have a cross shape having a smaller size than the cross shape of each of the preliminary horizontal layers 14A. The preliminary horizontal layers 14A may have a shape in which a plurality of cross shapes has been merged. The horizontal layers 14B may have a shape in which cross shapes thereof have been individually separated in the third direction D3. The horizontal layer level gap 14R may be formed between the horizontal layers 14B that are disposed in the third direction D3. The first and second sacrificial pillar structures SV1 and SV2 may be disposed between the horizontal layers 14B in the second direction D2.

After the cell isolation openings 23A and 23B are opened as described above, the trimming (i.e., the first trimming process) the inter-level dielectric layers 19 and the trimming (i.e., the second trimming process) the preliminary horizontal layers 14A may be sequentially performed. The first and second trimming processes may be dominantly performed in the third direction D3. A trimming width of the inter-level dielectric layer 19 and a trimming width of the preliminary horizontal layer 14A may be the same. If the preliminary horizontal layers 14A are trimmed by the second trimming process after the inter-level dielectric layers 19 are trimmed by the first trimming process, an attack to the lower structure 11 can be reduced although a loading effect occurs because a trimming target of the preliminary horizontal layers 14A is reduced by about 20 times. As a result, the supporting force of the supporter 11P can be enhanced because a loss of the supporter 11P is minimized.

As a comparative example, if the inter-level dielectric layers 19 are trimmed after the preliminary horizontal layers 14A are trimmed, a loss of the supporter 11P may, thus, be increased significantly while the preliminary horizontal layers 14A are trimmed.

As another comparative example, if the inter-level dielectric layers 19 are not trimmed after the preliminary horizontal layers 14A are trimmed, a void may be caused when subsequent horizontal layer level spacers are formed because the horizontal layer level gaps 14R have small vertical heights.

Figure 11A:
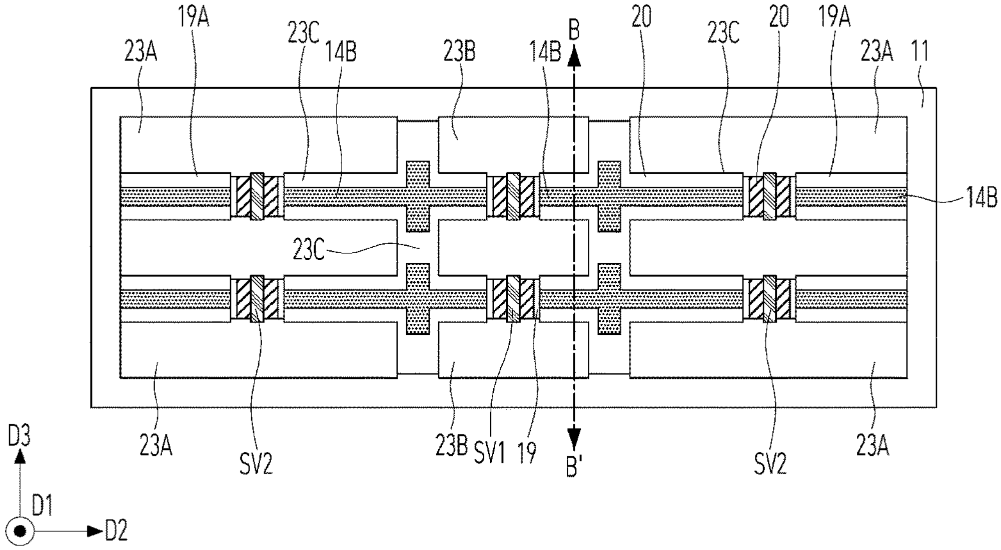
Figure 11B:
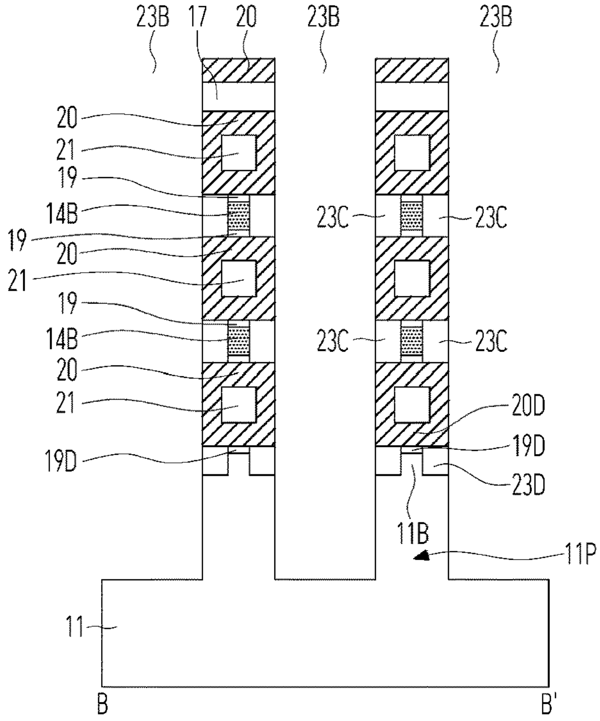

FIG. 11A is a plan view illustrating a method of forming a horizontal layer level spacer 23C. FIG. 11B is a cross-sectional view taken along line B-B' in FIG. 11A.

As illustrated in FIGS. 11A and 11B, the horizontal layer level spacers 23C may be formed on the sides of the horizontal layers 14B. Forming the horizontal layer level spacers 23C may include forming a spacer material on the sides of the horizontal layers 14B and also etching the formed spacer material. The horizontal layer level spacers 23C may include a dielectric material, for example, silicon oxide. The horizontal layer level spacers 23C may fill the horizontal layer level gaps 14R. This method is advantageous because it makes it possible to easily control a void when the horizontal layer level spacers 23C are formed because the vertical heights of the horizontal layer level gaps 14R are large. That is, the void-free horizontal layer level spacers 23C may be formed.

The horizontal layers 14B that are disposed in the third direction D3 may be isolated from each other by the horizontal layer level spacers 23C.

While the horizontal layer level spacers 23C are formed, protection layer level spacers 23D may be formed on the sides of the thin protruding parts 11B and the first protection layer 19D.

Figure 12A:
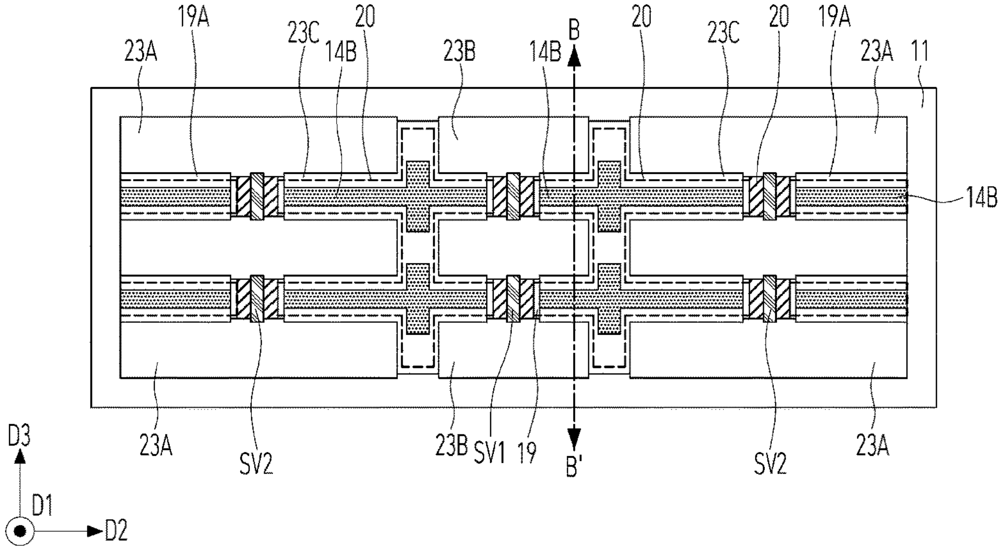
Figure 12B:
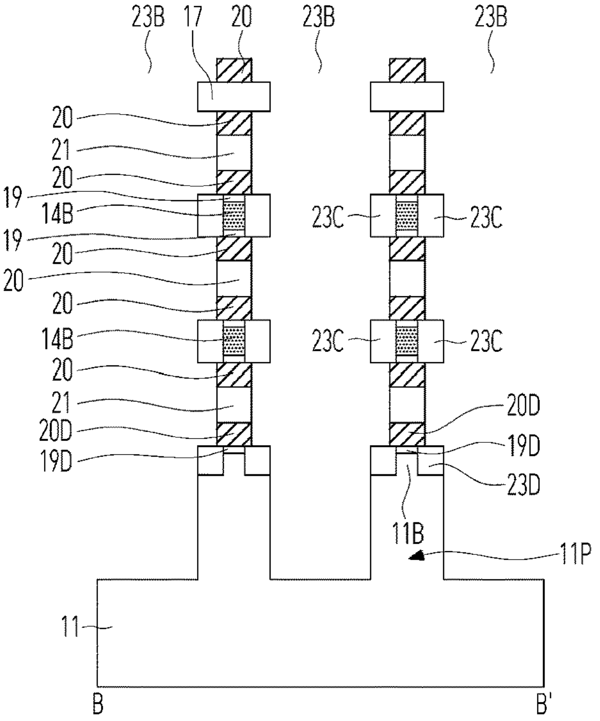

FIG. 12A is a plan view illustrating the recesses of the horizontal conductive layers. FIG. 12B is a cross-sectional view taken along line B-B' in FIG. 12A.

As illustrated in FIGS. 12A and 12B, parts of the horizontal conductive layers 20 may be horizontally trimmed through the cell isolation openings 23A and 23B. Accordingly, when viewed from line B-B', a pair of horizontal conductive layers 20 may be disposed between the horizontal layers 14B and one inter-cell dielectric layer 21 may be disposed between the pair of horizontal conductive layers 20.

Referring to FIGS. 9A and 9B, 10A and 10B, 11A and 11B, and 12A and 12B, the width of each of the horizontal conductive layers 20 in the third direction D3 between the cell isolation openings 23A and 23B may be greater than the width of each of the horizontal layers 14B. Incidentally, the trimming depth of each of the horizontal conductive layers 20 in the third direction D3 may be less than the trimming depth of each of the preliminary horizontal layers 14A.

A pair of horizontal conductive layers 20 may vertically overlap one horizontal layer 14B. The trimmed horizontal conductive layer 20 may also be referred to as a "trimmed target layer" or a "trimmed horizontal conductive layer".

Figure 13A:
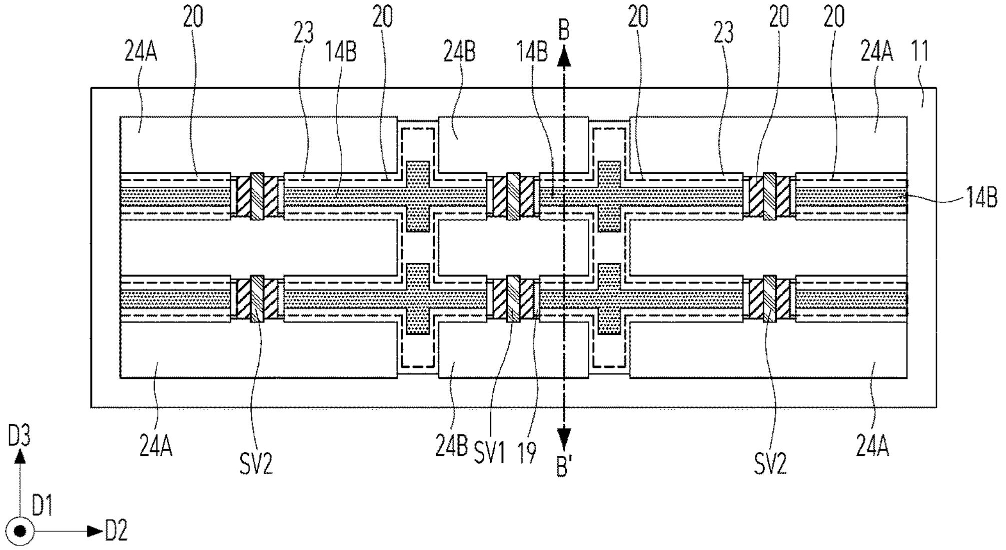
Figure 13B:
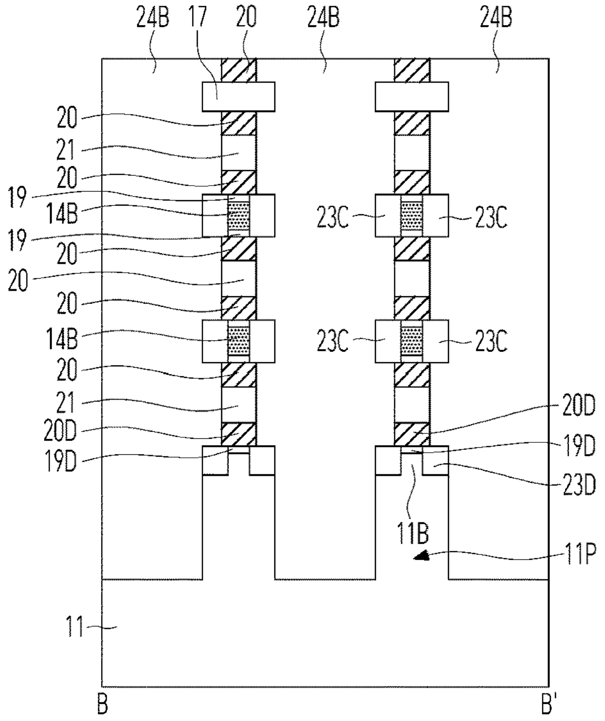
Figure 14:
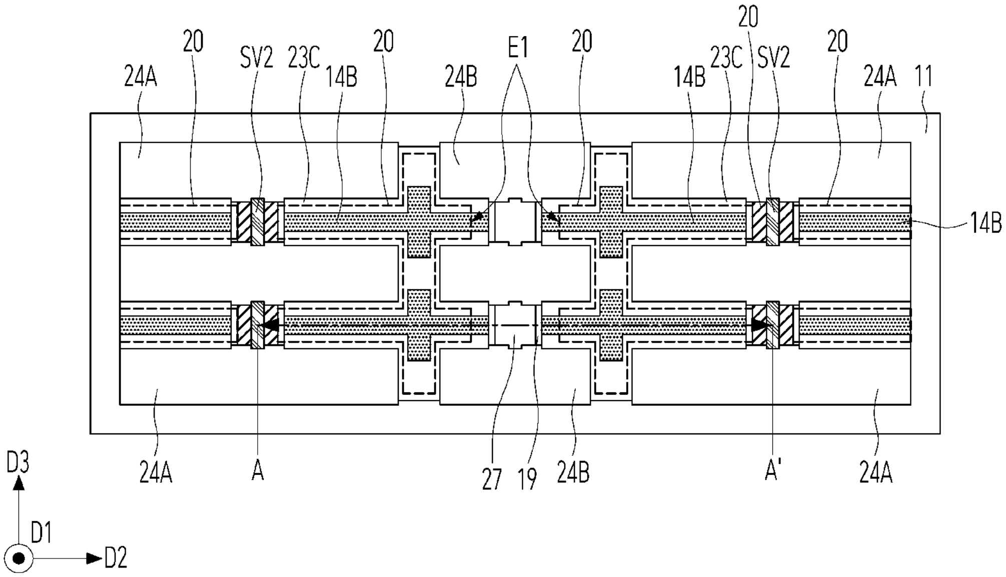

FIG. 13A is a plan view illustrating a method of forming cell isolation layers 24A and 24B. FIG. 13B is a cross-sectional view taken along line B-B' in FIG. 13A. FIG. 14 is a plan view at the level of the horizontal conductive layer 20 illustrating a method of forming the cell isolation layers 24A and 24B.

As illustrated in FIGS. 13A and 13B, the cell isolation layers 24A and 24B that fill the cell isolation openings 23A and 23B may be formed. The cell isolation layers 24A and 24B may include first cell isolation layers 24A and second cell isolation layers 24B. The first and second cell isolation layers 24A and 24B may include the same material, for example, a dielectric material. The dielectric material for the first and second cell isolation layers 24A and 24B may include silicon oxide, silicon nitride, silicon carbon oxide, silicon carbon nitride, or any combination thereof. From a top view, the outermost materials of the first and second cell isolation layers 24A and 24B may include silicon carbon oxide.

Forming the first and second cell isolation layers 24A and the second cell isolation layers 24B may include forming a cell isolation material that fills the cell isolation openings 22A and 22B and planarizing the cell isolation material and the highest horizontal conductive layer 20 so that a surface of the hard mask layer pattern 17 is exposed. The first and second cell isolation layers 24A and 24B may have different sizes or different volumes. The first and second cell isolation layers 24A may include a dual structure of silicon oxide and silicon carbon oxide. For example, after silicon oxide is deposited, silicon carbon oxide may be deposited. In another embodiment, the first and second cell isolation layers 24A and 24B may include an embedded air gap. The embedded air gap may be provided when silicon carbon oxide is deposited. The second sacrificial pillar structure SV2 may be disposed between the first cell isolation layers 24A in the third direction D3. The first sacrificial pillar structure SV1 may be disposed between the second cell isolation layers 24B in the third direction D3. The first and second cell isolation layers 24A and 24B may vertically extend in the first direction D1.

The first and second cell isolation layers 24A and 24B may correspond to the cell isolation layers ISOA and ISOB, such as those illustrated in FIGS. 2 to 3B.

The first and second cell isolation layers 24A and 24B and the horizontal conductive layers 20 may come in direct contact with each other. The horizontal layer level spacer 23C may be disposed between the horizontal layers 14B and the first and second cell isolation layers 24A and 24B.

FIG. 14 is a plan view illustrating a method of forming a first hole-shaped vertical opening 27. FIGS. 15A to 15D may be cross-sectional views taken along line A-A' in FIG. 14.

Figure 15A:
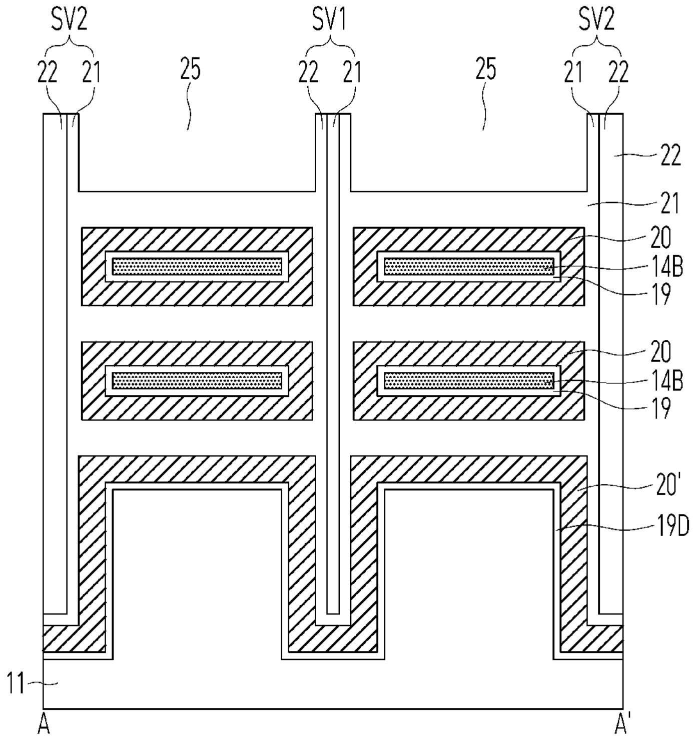

First, as illustrated in FIG. 15A, in order to form a hard mask level recess 25, the hard mask layer pattern 17 and the highest-level horizontal conductive layer 20 may be removed.

Figure 15B:
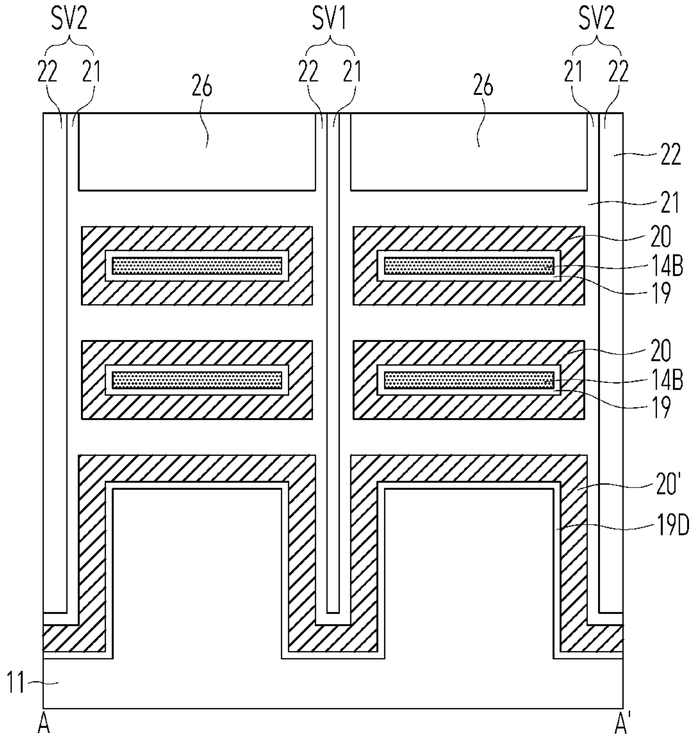

As illustrated in FIG. 15B, a top dielectric layer 26 that fills the hard mask level recess 25 may be formed. The top dielectric layer 26 may include silicon oxide.

Figure 15C:
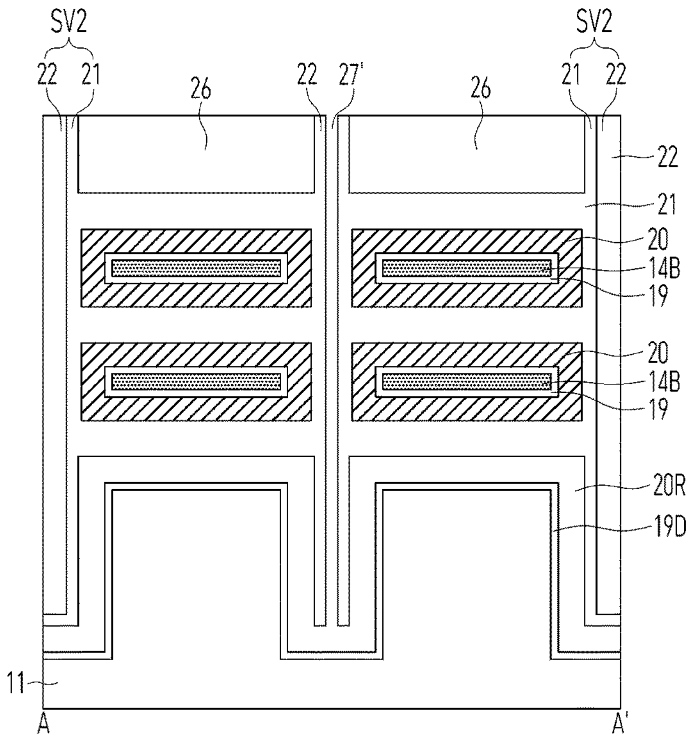

As illustrated in FIG. 15C, forming a vertical level path 27' includes removing the sacrificial pillar 22 of the first sacrificial pillar structure SV1.

The dummy horizontal conductive layer 20D may be exposed by etching the inter-cell dielectric layer 21 at the bottom of the vertical level path 27'.

Next, a lower level gap 20R may be formed by removing the dummy horizontal conductive layer 20D.

Figure 15D:
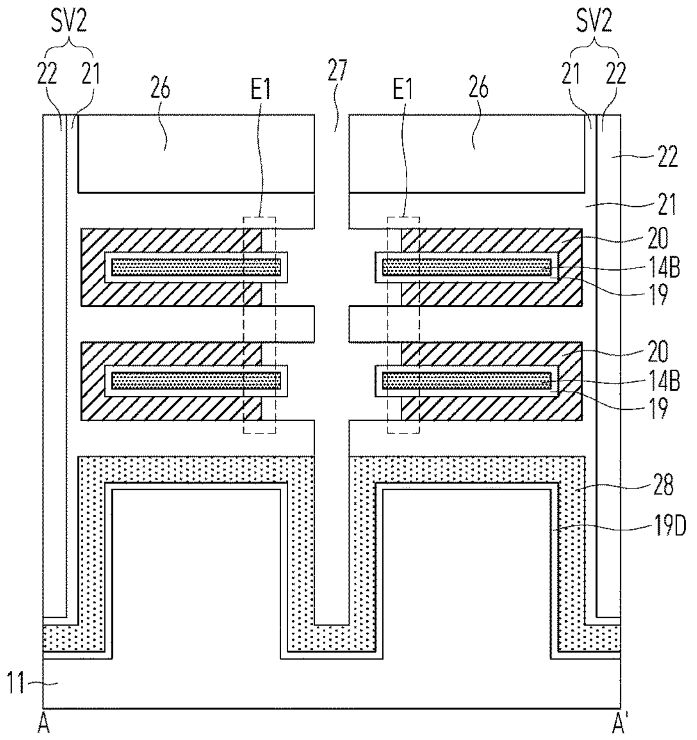

As illustrated in FIG. 15D, the lower level gap 20R may be filled with the second protection layer 28. The second protection layer 28 may include silicon oxide. The first protection layer 19D may remain between the second protection layer 28 and the lower structure 11. The first protection layer 19D may also be referred to as a first lower protection layer. The second protection layer 28 may also be referred to as a second lower protection layer.

Next, in order to form the first hole-shaped vertical opening 27, the inter-cell dielectric layers 21 may be horizontally cut.

Subsequently, one sides of the horizontal conductive layers 20 may be selectively recessed from the first hole-shaped vertical opening 27. Parts of the inter-level dielectric layers 19 may be exposed by the partial recesses of the horizontal conductive layers 20.

The process of recessing the horizontal conductive layers 20 may be abbreviated as a first side recess process of the horizontal conductive layers 20.

Figure 16A:
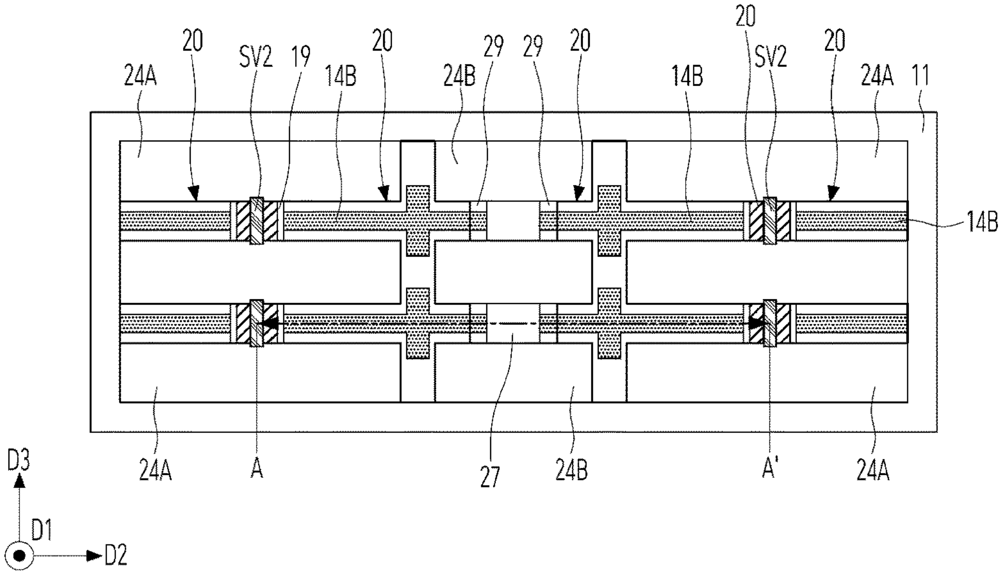
Figure 16B:
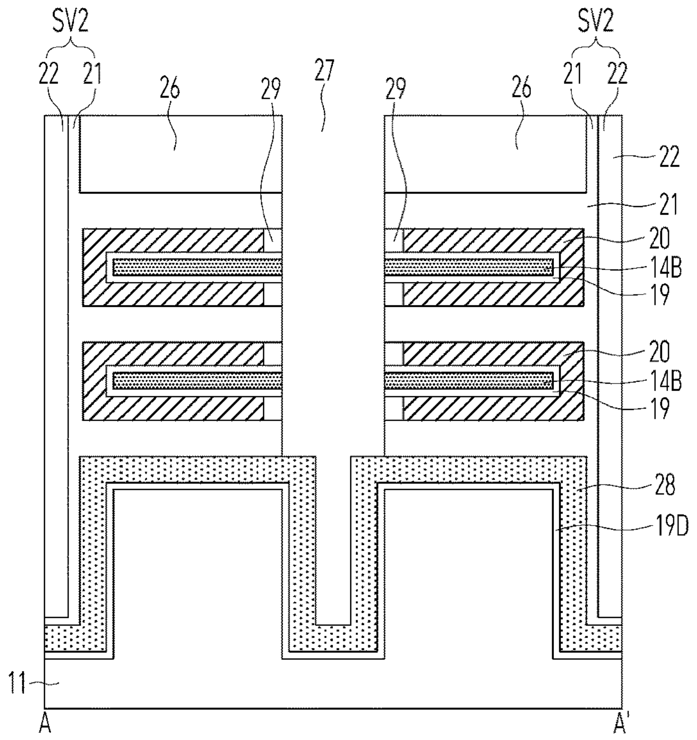

FIG. 16A is a plan view illustrating a method of forming a first capping layer 29. FIG. 16B is a cross-sectional view taken along line A-A' in FIG. 16A. FIG. 16A is a plan view at the level of the horizontal conductive layer 20 illustrating a method of forming the first capping layer 29.

As illustrated in FIGS. 16A and 16B, the first capping layer 29 may be formed on the recessed sides of the horizontal conductive layers 20. The first capping layer 29 may include silicon oxide, silicon nitride, silicon carbon oxide, an embedded air gap, or any combination thereof. In order to form the first capping layer 29, deposition and etch back may be performed on the capping material.

While the first capping layer 29 is formed, parts of the inter-level dielectric layers 19 may be cut. Accordingly, a first edge portion of each of the horizontal layers 14B may be exposed.

While the first capping layer 29 is formed or after the first capping layer 29 is formed, the second hole-shaped vertical opening 27 may be extended.

Figure 17A:
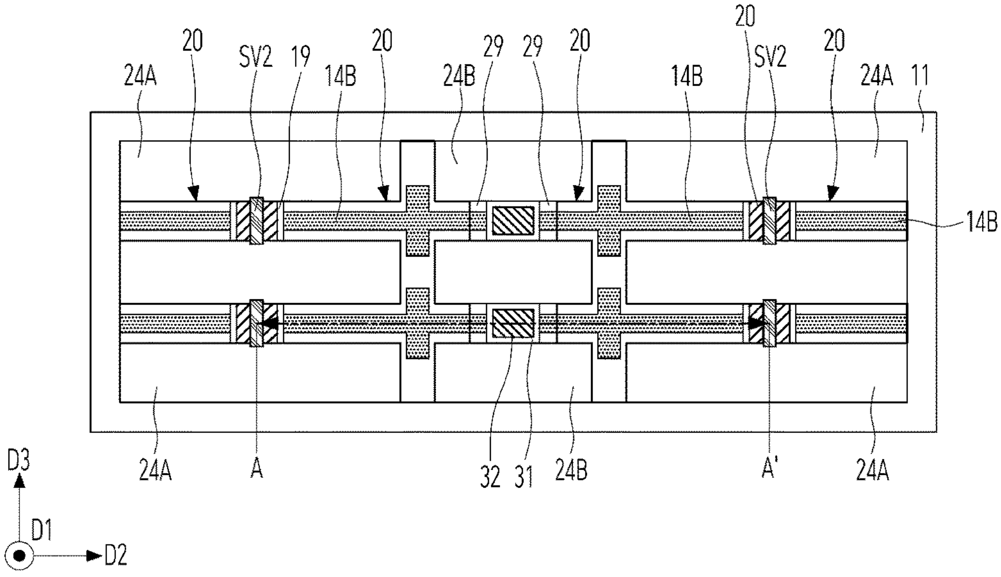
Figure 17B:
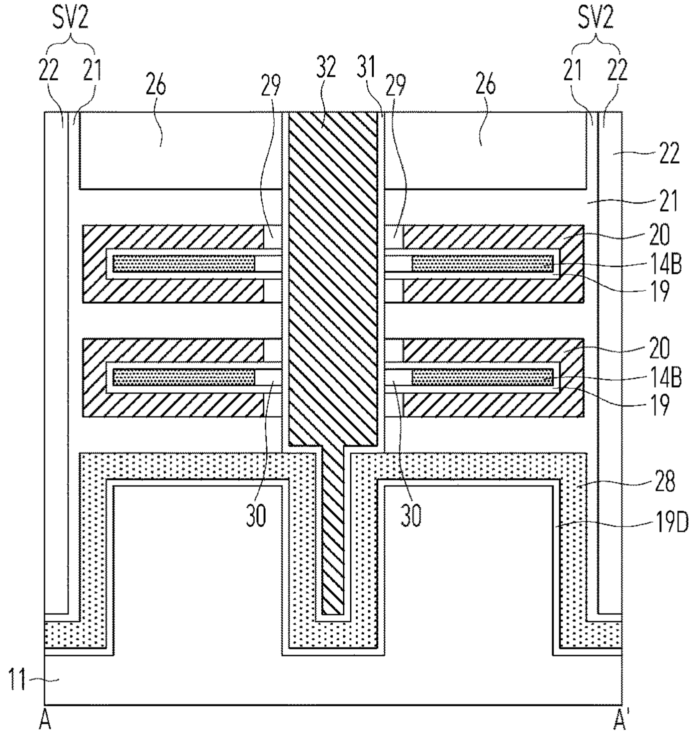

FIG. 17A is a plan view illustrating a method of forming a vertical conductive line 32. FIG. 17B is a cross-sectional view taken along line A-A' in FIG. 18A. FIG. 17A is a plan view at the level of the horizontal conductive layer 20 illustrating a method of forming the vertical conductive line 32.

As illustrated in FIGS. 17A and 17B, the vertical conductive line 32 that is connected to the first edge portion of each of the horizontal layers 14B may be formed. The vertical conductive line 32 may fill the first hole-shaped vertical opening 27. The vertical conductive line 32 may be connected to the horizontal layers 14B that have been arranged in the first direction D1 in common. The vertical conductive line 32 may include titanium nitride, tungsten, or any combination thereof. The vertical conductive line 32 may also be referred to as a bit line or a vertical bit line.

Before the vertical conductive line 32 is formed, a first doped region 30 and a first contact node 31 may be formed. The first doped region 30 may be formed within the first edge portion of each of the horizontal layers 14B. Forming the first doped region 30 may include an depositing polysilicon into which N type impurities have been doped, an annealing the deposited polysilicon, and an removing the doped polysilicon. The first doped region 30 may include impurities that have been diffused from the doped polysilicon. In another embodiment, the first doped region 30 may be formed by the process of doping impurities.

The second contact node 31 may include doped polysilicon. The first doped region 30 may include impurities that have been diffused from the second contact node 31.

The vertical conductive line 32 may correspond to the first conductive line BL, such as that illustrated in FIGS. 1A to 1D.

Figure 18A:
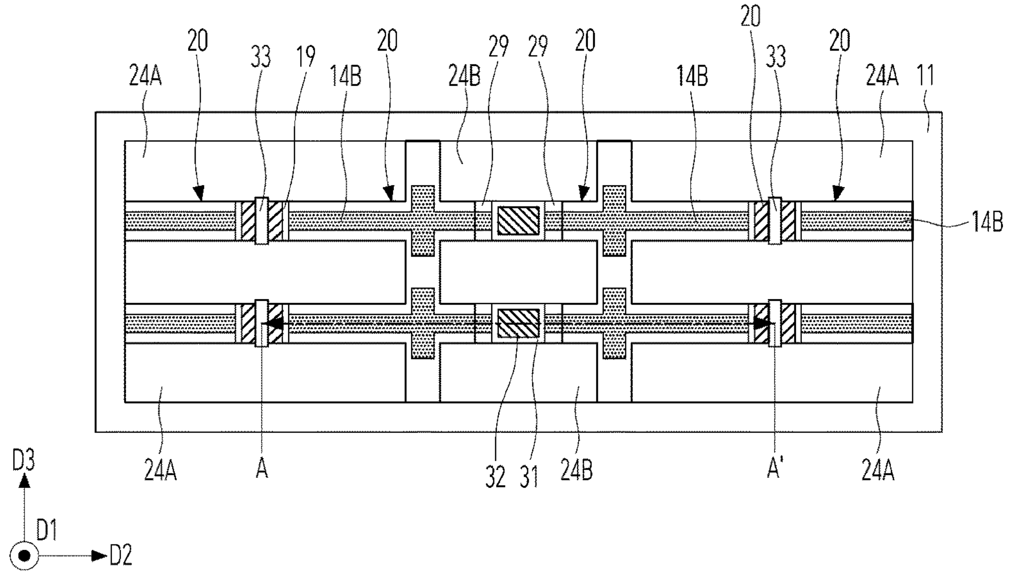
Figure 18B:
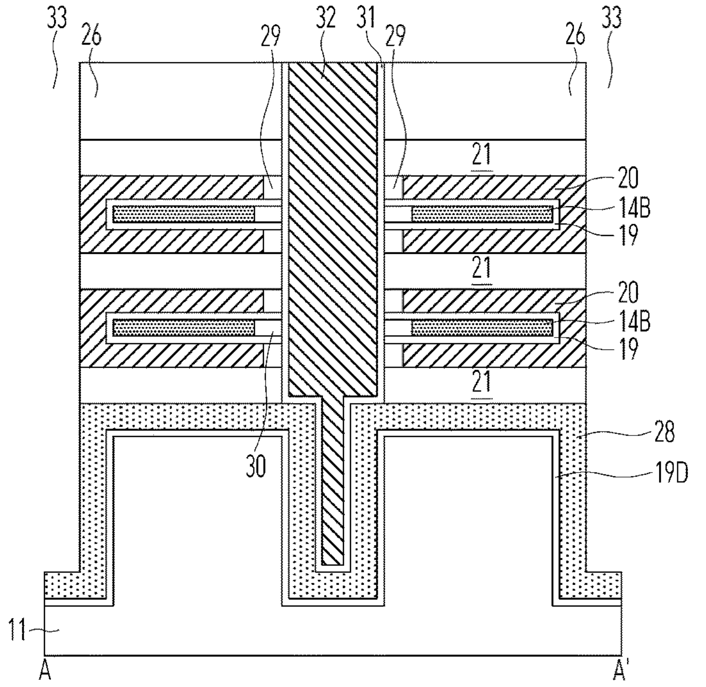

FIG. 18A is a plan view illustrating a method of forming preliminary second hole-shaped vertical openings 33. FIG. 18B is a cross-sectional view taken along line A-A' in FIG. 19A. FIG. 18A is a plan view at the level of the horizontal conductive layer 20 illustrating a method of forming the preliminary second hole-shaped vertical openings 33.

As illustrated in FIGS. 18A and 18B, in order to form the preliminary second hole-shaped vertical openings 33, a part of the second sacrificial pillar structure SV2 may be removed. One side of the horizontal conductive layers 20 may be exposed, and parts of the inter-cell dielectric layers 20 may be cut by the preliminary second hole-shaped vertical openings 33.

Figure 19A:
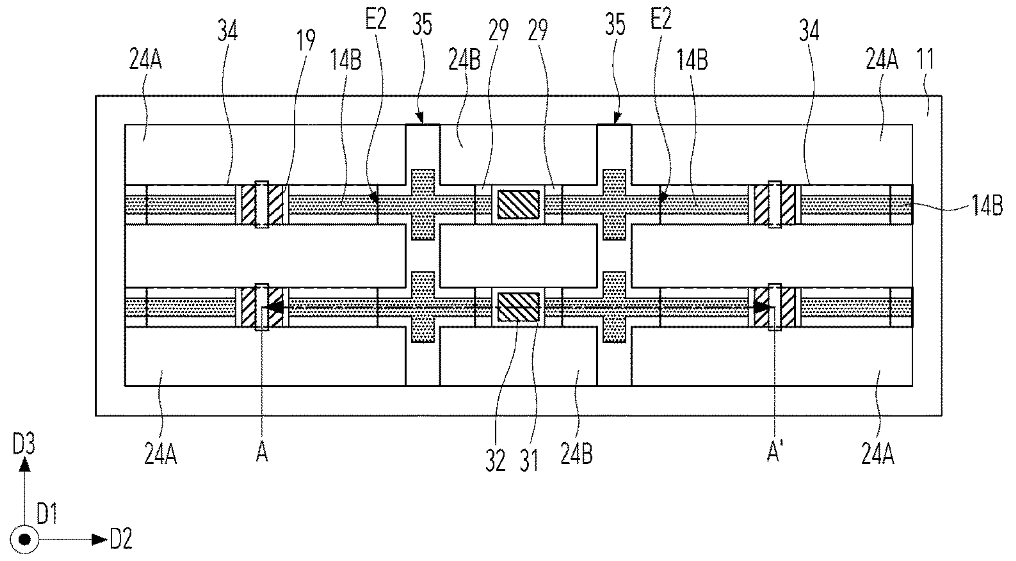
Figure 19B:
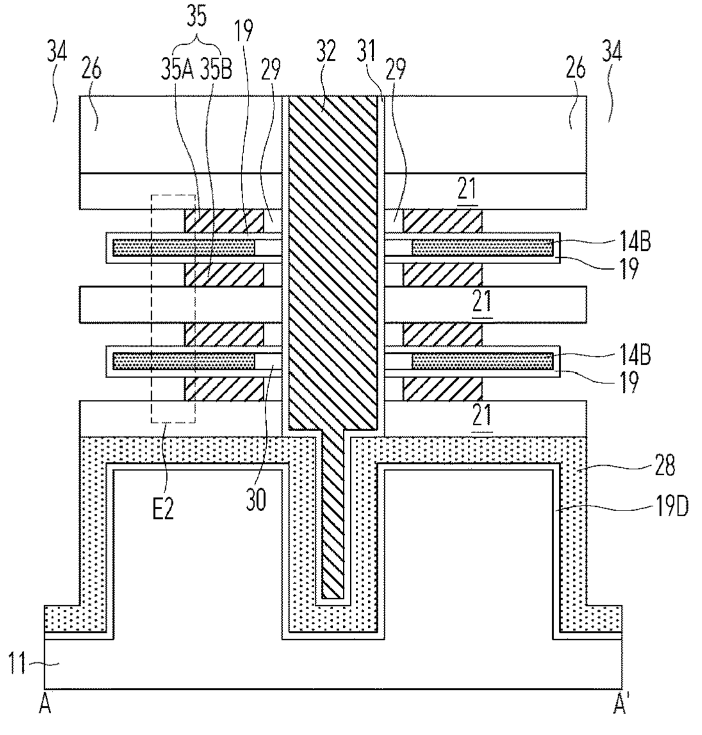

FIG. 19A is a plan view illustrating a method of forming horizontal conductive lines 35. FIG. 19B is a cross-sectional view taken along line A-A' in FIG. 19A.

As illustrated in FIGS. 19A and 19B, other sides of the horizontal conductive layers 20 may be selectively recessed through the preliminary second hole-shaped vertical openings 33. Accordingly, the horizontal conductive lines 35 may be formed.

The horizontal conductive line 35 may include a pair of first and second horizontal conductive lines 35A and 35B that face each other with the horizontal layer 14B interposed therebetween. The first and second horizontal conductive lines 35A and 35B may each include a metal-based material, a semiconductor material, or any combination thereof. The first and second horizontal conductive lines 35A and 35B may each include titanium nitride, tungsten, polysilicon, or any combination thereof. For example, the first and second horizontal conductive lines 35A and 35B may include a TiN/W stack on which titanium nitride and tungsten have been sequentially stacked. The first and second horizontal conductive lines 35A and 35B may each include an N type work function material or a P type work function material. The N type work function material may have a low work function of 4.5 eV or less. The P type work function material may have a high work function of more than 4.5 eV.

The horizontal conductive line 35 may correspond to the second conductive line DWL, such as that illustrated in FIGS. 1A to 1D. The first and second horizontal conductive lines 35A and 35B may correspond to the upper horizontal line G1 and the lower horizontal line G2. As illustrated in FIGS. 1A to 1D, the first and second horizontal conductive lines 35A and 35B may each have a cross shape, and may each include the channel overlapping portion WLP and the channel non-overlapping portions NOL.

As in the series of processes referenced, forming the horizontal conductive line 35 may include forming the inter-level dielectric layer 19 that covers a surface of the preliminary horizontal layer 14B, forming the horizontal conductive layer 20 that surrounds the preliminary horizontal layer 14B on the inter-level dielectric layer 19, and performing a first side recess process and a second side recess process on the horizontal conductive layer 20. A first edge portion (refer to "E1" in FIG. 15D) of the horizontal conductive line 35 may be defined by the first side recess process. A second edge portion (refer to "E2" in FIGS. 19A and 19B) of the horizontal conductive line 35 may be defined by the second side recess process.

A gate oxide intensity (GOI) characteristic of the inter-level dielectric layer 19 may, thus, be improved significantly because the first side recess process and the second side recess process are used to form the horizontal conductive line 35. The thickness of the inter-level dielectric layer 19 can be uniformly maintained.

In another embodiment, the first and second horizontal conductive lines 35A and 35B of the horizontal conductive line 35 may have a triple work function electrode structure. Accordingly, a gate induced drain leakage (GIDL) may, thus, be reduced significantly.

After the horizontal conductive line 35 is formed, the preliminary second hole-shaped vertical openings may be extended as indicated by reference numeral "34". Hereinafter, the extended preliminary second hole-shaped vertical openings may be abbreviated as second hole-shaped vertical openings 34.

Figure 20A:
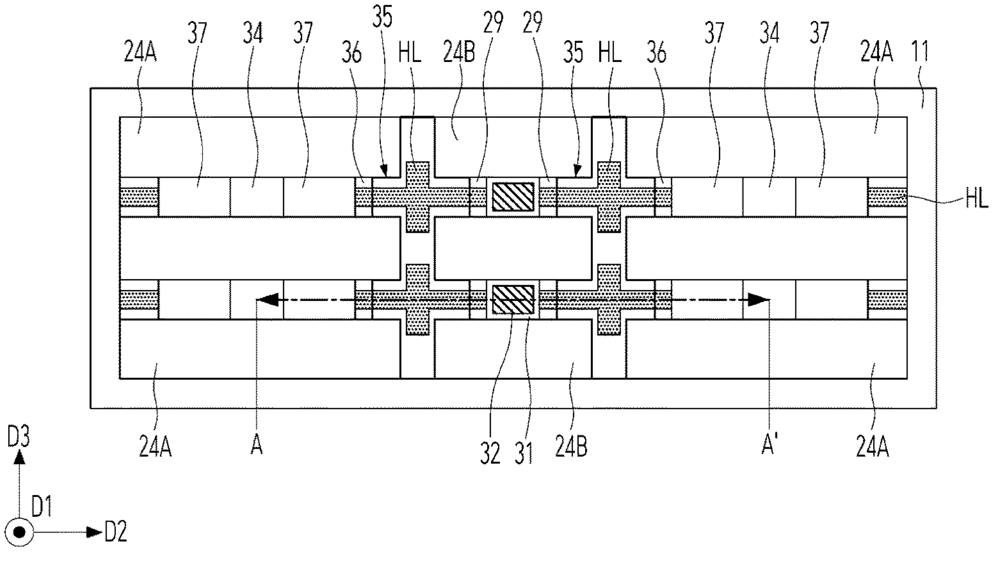
Figure 20B:
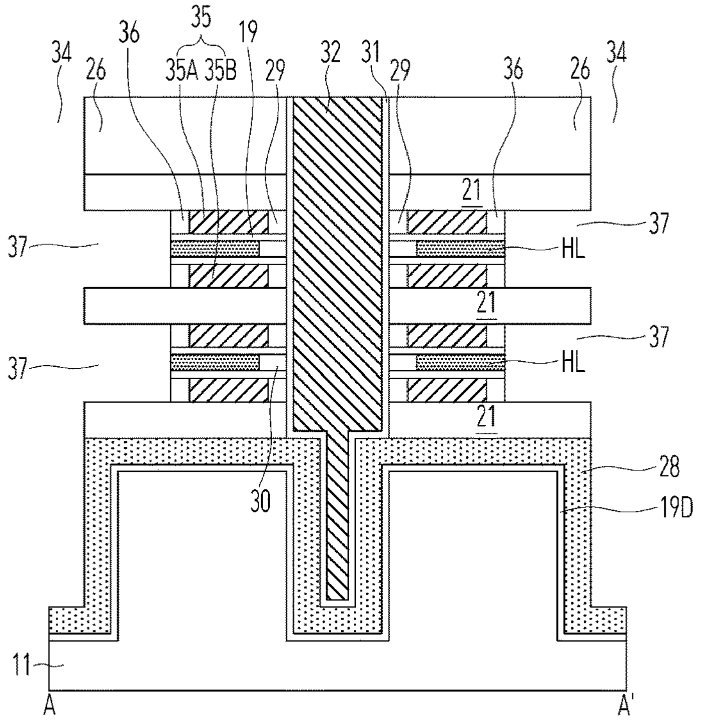

FIG. 20A is a plan view illustrating a method of forming storage openings 38. FIG. 20B is a cross-sectional view taken along line A-A' in FIG. 20A.

As illustrated in FIGS. 20A and 20B, forming the second capping layers 36 includes depositing and etching a capping material. The second capping layers 36 may include silicon oxide, silicon nitride, or any combination thereof.

After the second capping layers 36 are formed, the inter-level dielectric layers 19 may be horizontally recessed in the second direction D2. Subsequently, the second edge portions of the horizontal layers 14B may be horizontally recessed in the second direction D2. Accordingly, the horizontal layers may remain as indicated by reference numeral "HL".

As the second capping layer 36 and the horizontal layer HL are formed as described above, the storage openings 37 that horizontally extend from the second hole-shaped vertical openings 34 may be formed. The storage openings 37 may also be referred to as capacitor openings.

The horizontal layers HL may each include a first edge and a second edge. The first edge refers to a portion that is connected to the first contact node 31 and the vertical conductive line 32. The second edge refers to a portion that is exposed by the storage openings 37.

The storage openings 37 may be disposed between the inter-cell dielectric layers 21 that are vertically adjacent to each other. Second capping layers 36 may be disposed over and under each of the horizontal layers HL.

Figure 21A:
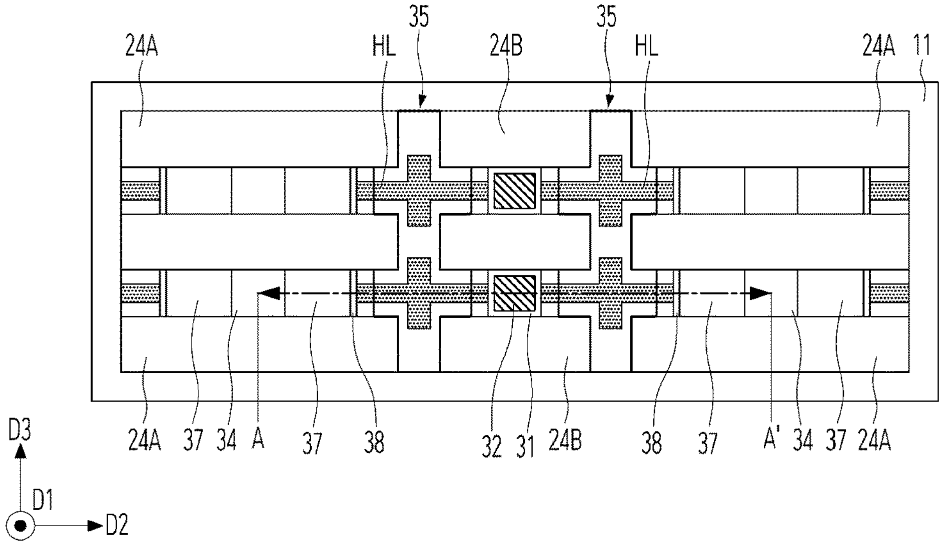
Figure 21B:
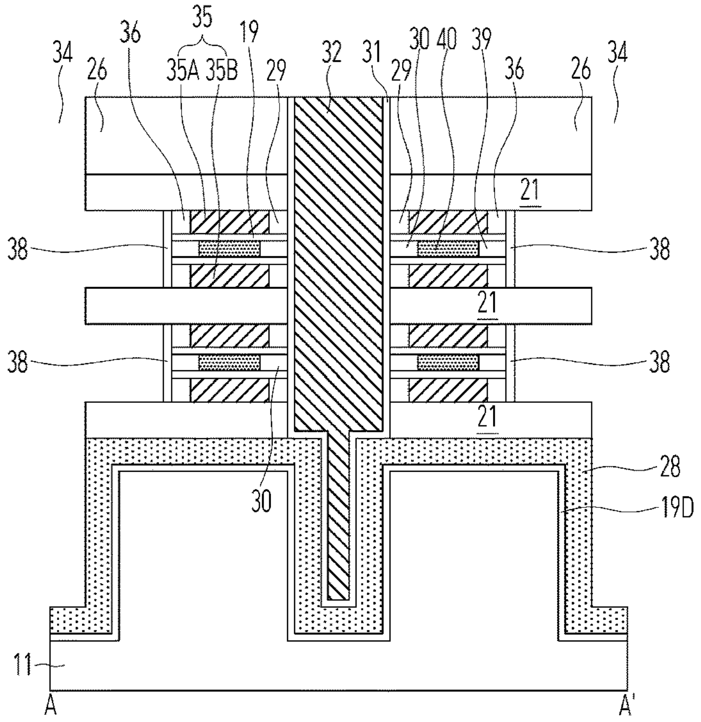

FIG. 21A is a plan view illustrating a method of forming a second contact node 38. FIG. 21B is a cross-sectional view taken along line A-A' in FIG. 21A.

As illustrated in FIGS. 21A and 21B, a second doped region 39 may be formed within the second edge of the horizontal layer HL. Forming the second doped region 39 may include depositing polysilicon into which N type impurities have been doped, annealing deposited polysilicon, and removing the doped polysilicon. The second doped region 39 may include impurities that have been diffused from the doped polysilicon. In another embodiment, after the annealing, the doped polysilicon may be made to remain.

The second contact node 38 may be formed on the second edge of the horizontal layer HL. The second contact node 38 may include the doped polysilicon. The second doped region 39 may include impurities that have been diffused from the second contact node 38.

The horizontal layer HL may include the first doped region 30, the second doped region 39, and a channel 40 that have been horizontally disposed in the second direction D2. The channel 40 may be defined between the first doped region 30 and the second doped region 39. The channel 40 may vertically overlap with the horizontal conductive line 35. As illustrated in FIGS. 1A to 1C, the horizontal layer HL may have a cross shape, and the channel 40 may also have a cross shape.

Figure 22A:
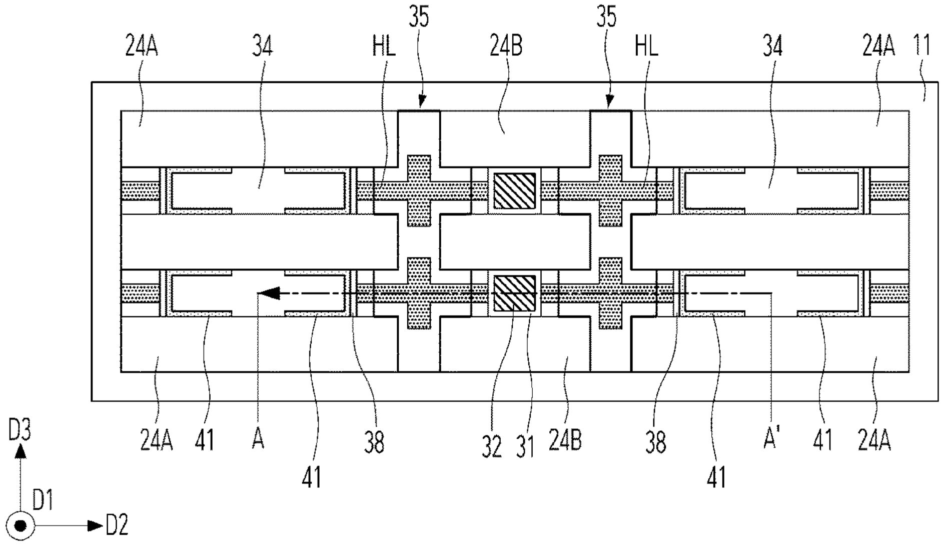
Figure 22B:
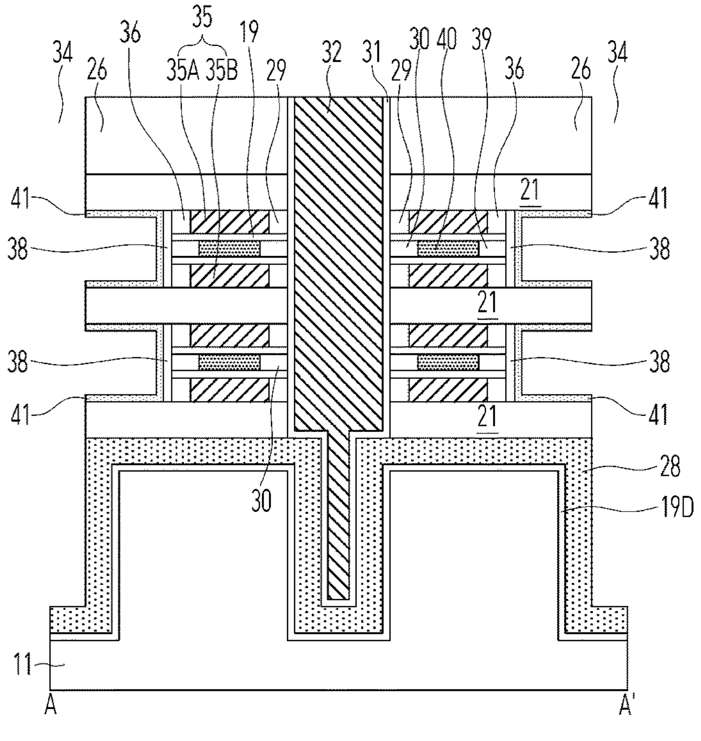

FIG. 22A is a plan view illustrating a method of forming a first electrode 41. FIG. 22B is a cross-sectional view taken along line A-A' in FIG. 22A.

As illustrated in FIGS. 22A and 22B, the first electrode 41 of the data storage element may be formed on the second contact node 38. The first electrode 41 may have a horizontally oriented cylinder shape.

Figure 23A:
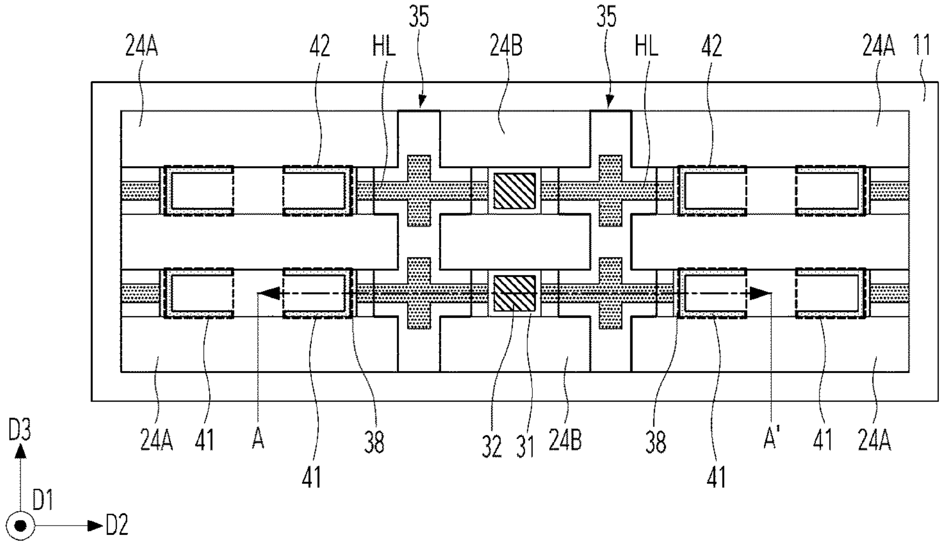
Figure 23B:
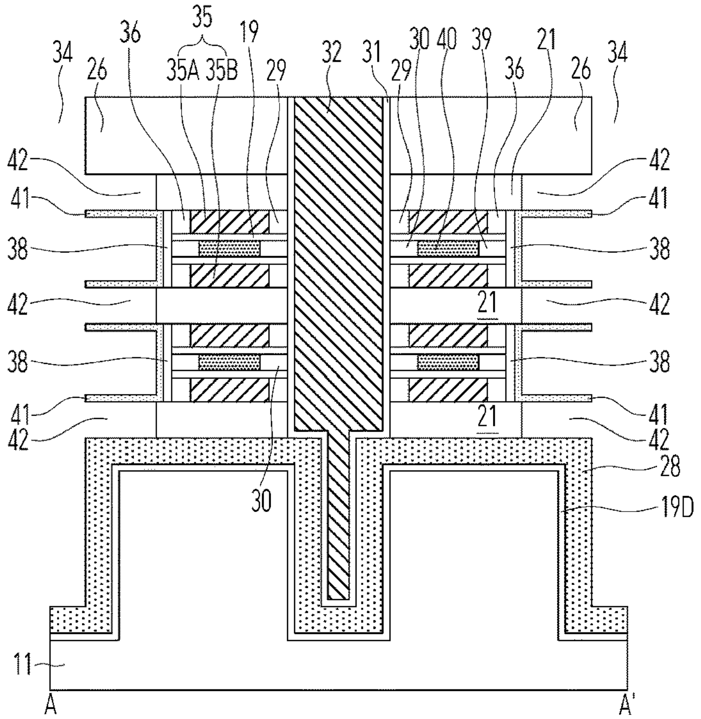

FIG. 23A is a plan view illustrating a method of exposing the outer walls of the first electrodes 41. FIG. 23B is a cross-sectional view taken along line A-A' in FIG. 23A.

As illustrated in FIGS. 23A and 23B, the inter-cell dielectric layers 21 may be horizontally recessed (reference numeral 42) to expose the outer surfaces of the first electrode 41. The recessed inter-cell dielectric layers 21 may correspond to the inter-cell dielectric layers IL, such as those illustrated in FIG. 3B.

Figure 24A:
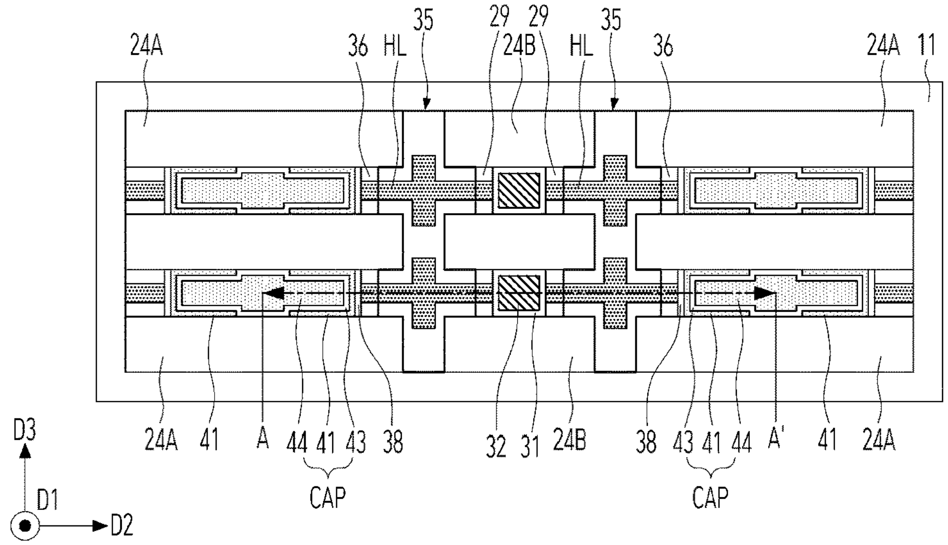
Figure 24B:
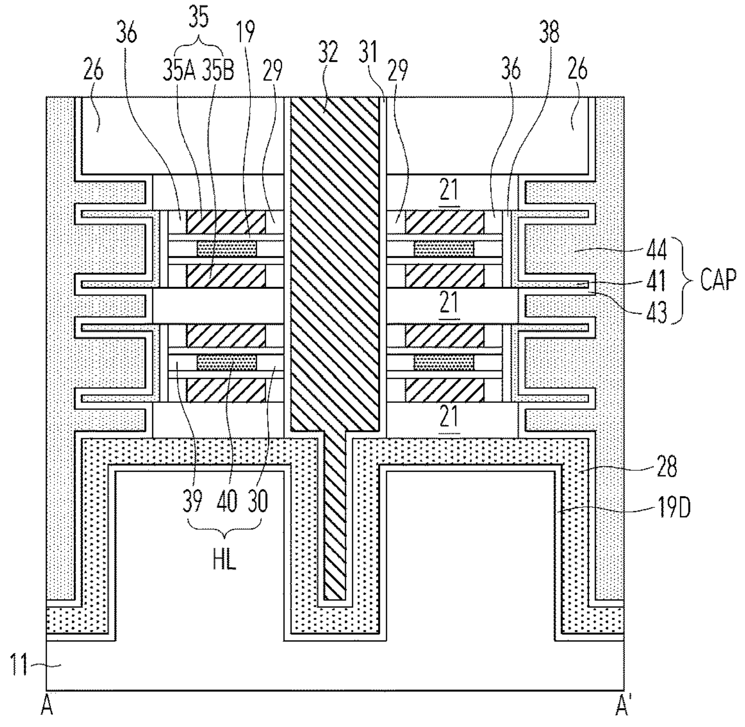

FIG. 24A is a plan view illustrating a method of forming a dielectric layer 43 and a second electrode 44. FIG. 24B is a cross-sectional view taken along line A-A' in FIG. 24A.

As illustrated in FIGS. 24A and 24B, the dielectric layer 43 may be formed on the first electrodes 41. The second electrode 44 may be formed on the dielectric layer 43. The first electrode 41, the dielectric layer 43, and the second electrode 44 may become the data storage element CAP.

The individual first electrode 41 may include an inner space and a plurality of outer surfaces. The inner space of the first electrode 41 may include a plurality of inner surfaces. The outer surfaces of the first electrode 41 may include a vertical outer surface and a plurality of horizontal outer surfaces. The vertical outer surface of the first electrode 41 may vertically extend in the first direction D1. The horizontal outer surfaces of the first electrode 41 may horizontally extend in the second direction D2 or the third direction D3. The inner space of the first electrode 41 may be a 3-D space. The dielectric layer 43 may conformally cover the inner surfaces and outer surfaces of the first electrode 41. The second electrode 44 may be disposed in the inner space of the first electrode 41 on the dielectric layer 43. Some of the outer surfaces of the first electrode 41 may be electrically connected to the second doped region 39 and second contact node 38 of the horizontal layer HL.

The first electrode 41 may have a cylinder shape. The cylinder shape of the first electrode 41 may include cylinder inner surfaces and cylinder outer surfaces. Some of the cylinder outer surfaces of the first electrode 41 may be electrically connected to the second doped region 39 and second contact node 38 of the horizontal layer HL. The dielectric layer 43 and the second electrode 44 may be disposed on the cylinder inner surfaces of the first electrode 41. The second electrode 44 may vertically extend in the first direction D1.

The first electrode 41 and the second electrode 44 may each include metal, precious metal, metal nitride, conductive metal oxide, conductive precious metal oxide, metal carbide, metal silicide, or any combination thereof. For example, the first electrode 41 and the second electrode 44 may each include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, a tungsten nitride/tungsten (WN/W) stack, or any combination thereof. The second electrode 44 may include a combination of a metal-based material and a silicon-based material. For example, the second electrode 44 may be a titanium nitride/silicon germanium/tungsten nitride (TiN/SiGe/WN) stack. In the titanium nitride/silicon germanium/tungsten nitride (TiN/SiGe/WN) stack, silicon germanium may be a gap-fill material that fills the inner space of the first electrode 41. Titanium nitride (TiN) may play a role as the second electrode 44 of the data storage element CAP. Tungsten nitride may be a low resistance material.

The dielectric layer 43 may also be referred to as a capacitor dielectric layer or a memory layer. The dielectric layer 43 may include silicon oxide, silicon nitride, a high-k material, a ferroelectric material, an anti-ferroelectric material, or any combination thereof. The high-k material of the dielectric layer 43 may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). The dielectric layer 42 may include a $ZrO_2/Al_2O_3$ (ZA) stack, a $ZrO_2/Al_2O_3/ZrO_2$ (ZAZ) stack, a $ZrO_2/Al_2O_3/ZrO_2/Al_2O_3$ (ZAZA) stack, a $ZrO_2/Al_2O_3/ZrO_2/Al_2O_3/ZrO_2$ (ZAZAZ) stack, a $HfO_2/Al_2O_3$ (HA) stack, a $HfO_2/Al_2O_3/HfO_2$ (HAH) stack, a $HfO_2/Al_2O_3/HfO_2/Al_2O_3$ (HAHA) stack, or a $HfO_2/Al_2O_3/HfO_2/Al_2O_3/HfO_2$ (HAHAH) stack.

In another embodiment, an interface control layer for reducing a leakage current may be further formed between the first electrode 41 and the dielectric layer 43. The interface control layer may include titanium oxide ($TiO_2$), tantalum oxide ($Ta_2O_5$), niobium oxide ($Nb_2O_5$), niobium nitride (NbN), or any combination thereof. The interface control layer may also be formed between the second electrode 41 and the dielectric layer 43.

According to the aforementioned embodiment, a cell gate oxide integrity (GOI) characteristic may, thus, be improved significantly because the inter-level dielectric layer 19 may uniformly cover a surface of the horizontal layer HL.

Furthermore, the yield for forming the horizontal conductive line 35 may, thus, be improved significantly by suppressing fumes of the horizontal conductive layer 20 because the horizontal conductive line 35 is formed by the recess processes of the horizontal conductive layer 20.

Furthermore, a bridge between a channel width and memory cells may, thus, be improved significantly because the cross-shaped horizontal layer HL is formed.

Furthermore, a bridge between the horizontal conductive lines 35 that have been vertically stacked may, thus, be improved significantly.

Furthermore, a bridge and channel width between cells may, thus, be improved significantly even after a process of forming the cell isolation dielectric layers 24A and 24B and a plurality of openings.

Figure 25A:
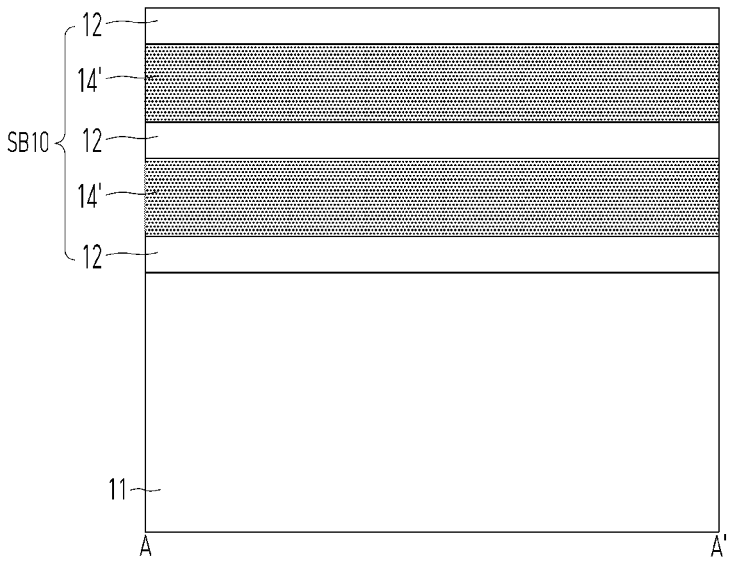
FIGS. 25A to 25C are cross-sectional views illustrating a method of manufacturing a semiconductor device according to another embodiment of the present disclosure.
Figure 25B:
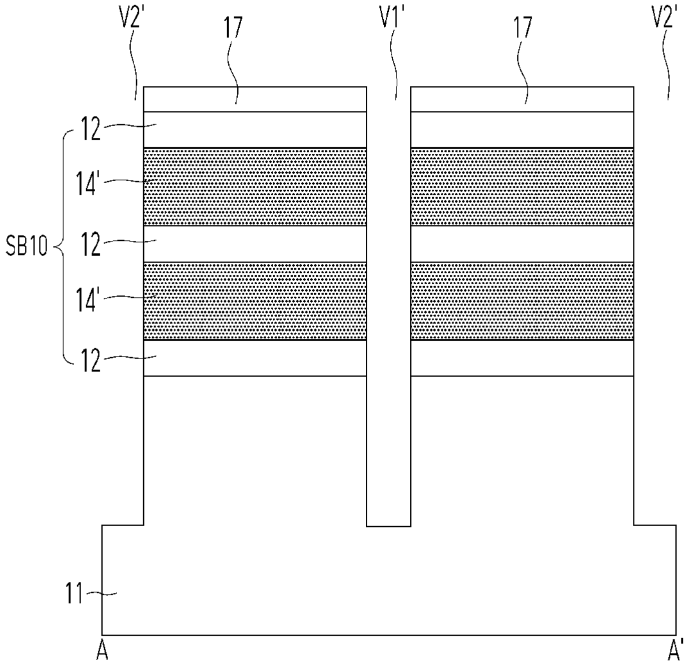
Figure 25C:
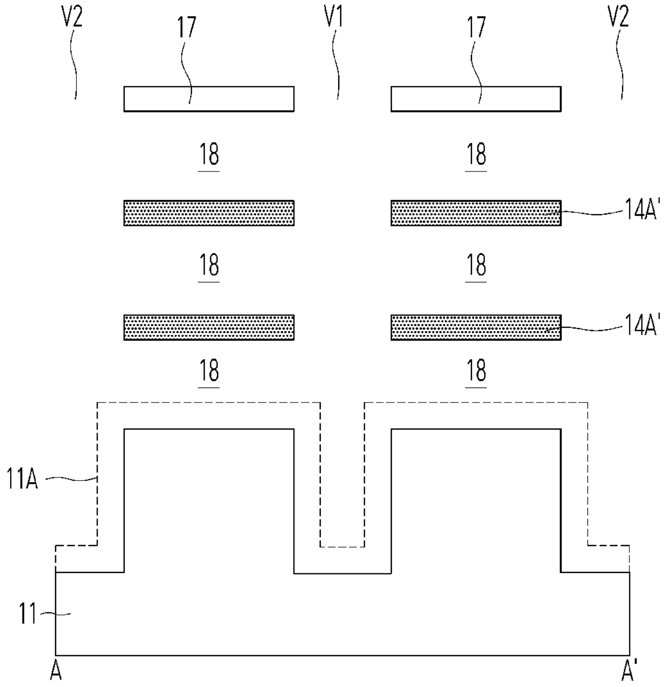

FIGS. 25A to 25C are cross-sectional views illustrating a method of manufacturing a semiconductor device according to another embodiment of the present disclosure.

As illustrated in FIG. 25A, a stack body SB10 may be formed on a lower structure 11. The stack body SB10 may include an alternate stack of first semiconductor layers and second semiconductor layers. For example, a plurality of silicon germanium layers 12 and a plurality of single crystalline silicon layers 14' may be alternately stacked in the alternate stack by epitaxial growth. The silicon germanium layers 12 may be sacrificial layers. The single crystalline silicon layers 14' may be recess target layers. That is, the silicon germanium layers 12 may correspond to the first layers 12A or the third layers 12B in FIG. 4B. The single crystalline silicon layers 14' may correspond to the fourth layers 14 in FIG. 4B. Unlike the stack body SB of FIG. 4B, the stack body SB10 may have the alternate stack of the silicon germanium layers 12 and the single crystalline silicon layers 14'.

Subsequently, a series of processes, such as those illustrated in FIGS. 4A to 5C, may be performed. For example, the sacrificial isolation openings 15A and 15B and the sacrificial isolation layers 16A and 16B may be formed in the stack body SB10.

As illustrated in FIG. 25B, a hard mask layer pattern 17 may be formed on the stack body SB10.

The stack body SB10 may be etched by using the hard mask layer pattern 17 as an etch barrier. Accordingly, a plurality of first and second sacrificial vertical openings V1' and V2' may be formed in the stack body SB10.

As illustrated in FIG. 25C, preliminary horizontal layers 14A' and horizontal-shaped recesses 18 may be formed. The preliminary horizontal layers 14A' and the horizontal-shaped recesses 18 may be formed by a process of recessing the silicon germanium layers 12 and the single crystalline silicon layers 14' in FIG. 25B. After the silicon germanium layers 12 are removed, the process of recessing the single crystalline silicon layers 14' may be performed. The preliminary horizontal layers 14A' may correspond to the preliminary horizontal layers 14A in FIG. 7B.

In order to recess the silicon germanium layers 12, wet etching or dry etching may be used. The silicon germanium layers 12 may be etched by using an etchant or an etch gas having selectivity to the single crystalline silicon layers 14'.

For example, hot SC-1 (HSC1) may be used in the process of recessing the single crystalline silicon layers 14' for forming the preliminary horizontal layers 14A'. HSC1 may include a solution in which ammonium hydroxide ($NH_4OH$), hydrogen peroxide ($H_2O_2$), and water ($H_2O$) are mixed at the ratio of 1:4:20, respectively. The single crystalline silicon layers 14' may be selectively etched by using such HSC1.

After the preliminary horizontal layers 14A' are formed, the first and second sacrificial vertical openings may be extended as indicated by reference numerals V1 and V2. The preliminary horizontal layers 14A' may be isolated from each other in the second direction D2 by the first and second sacrificial vertical openings V1 and V2. The preliminary horizontal layers 14A' may have a shape in which a plurality of cross shapes has been merged in the third direction D3. While the preliminary horizontal layers 14A' are formed, a surface of the lower structure 11 may be recessed at a predetermined depth (refer to reference numeral "11A"). Accordingly, the depths of the first and second sacrificial vertical openings V1 and V2 may be increased.

Subsequently, the series of processes illustrated in FIGS. 8A to 24B may be performed.

Figure 26:
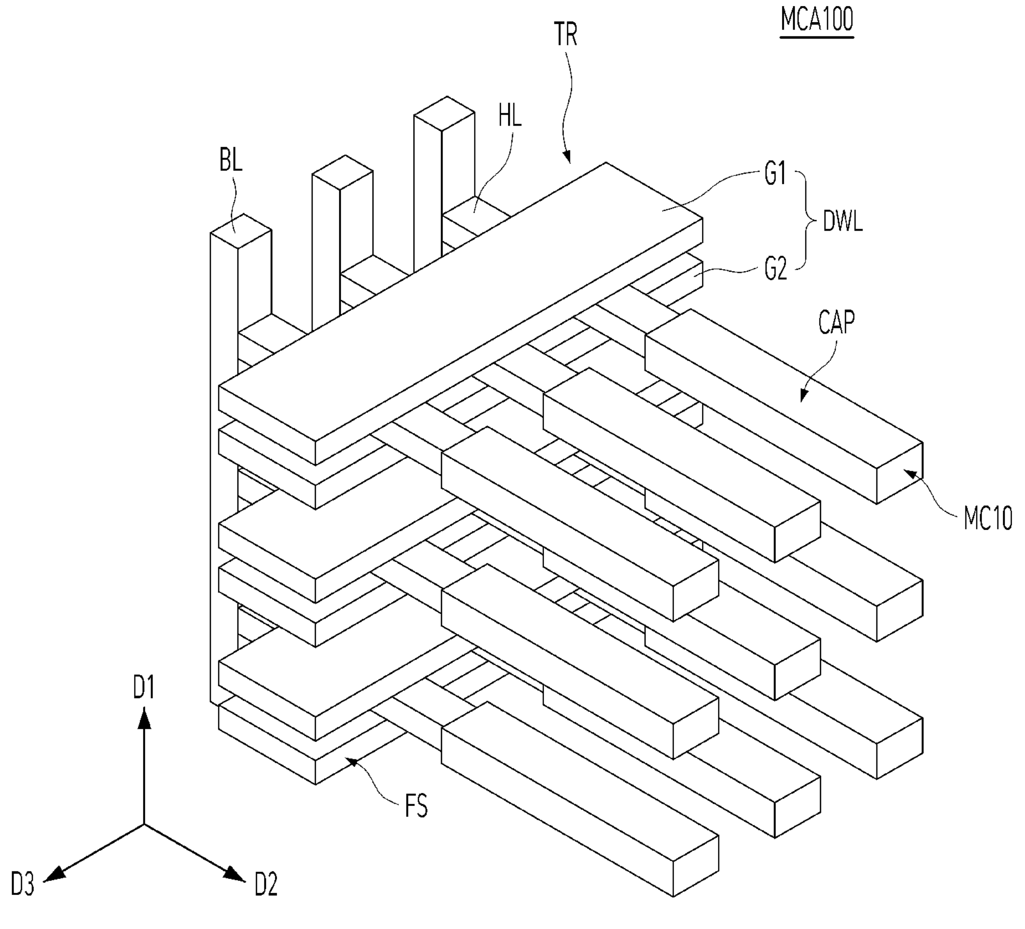
FIGS. 26 to 28 are perspective views illustrating memory cell arrays according to other embodiments of the present disclosure.
Figure 27:
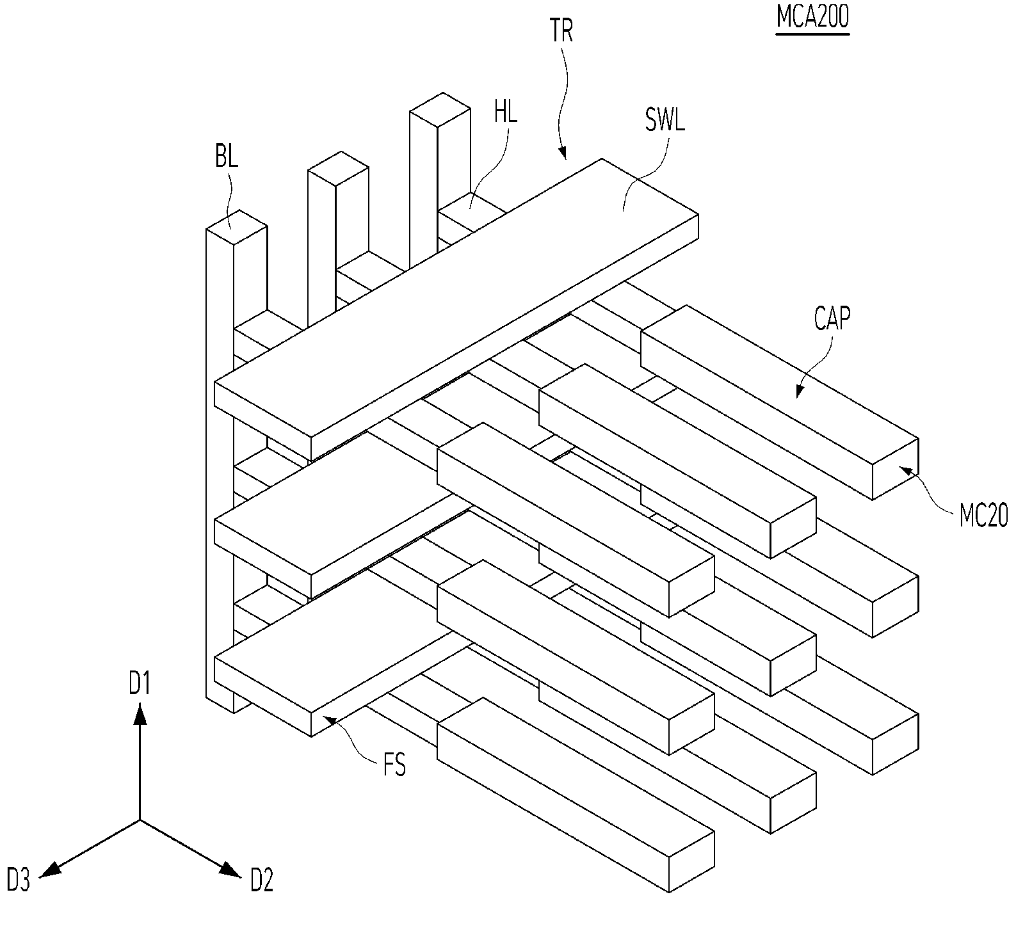
Figure 28:
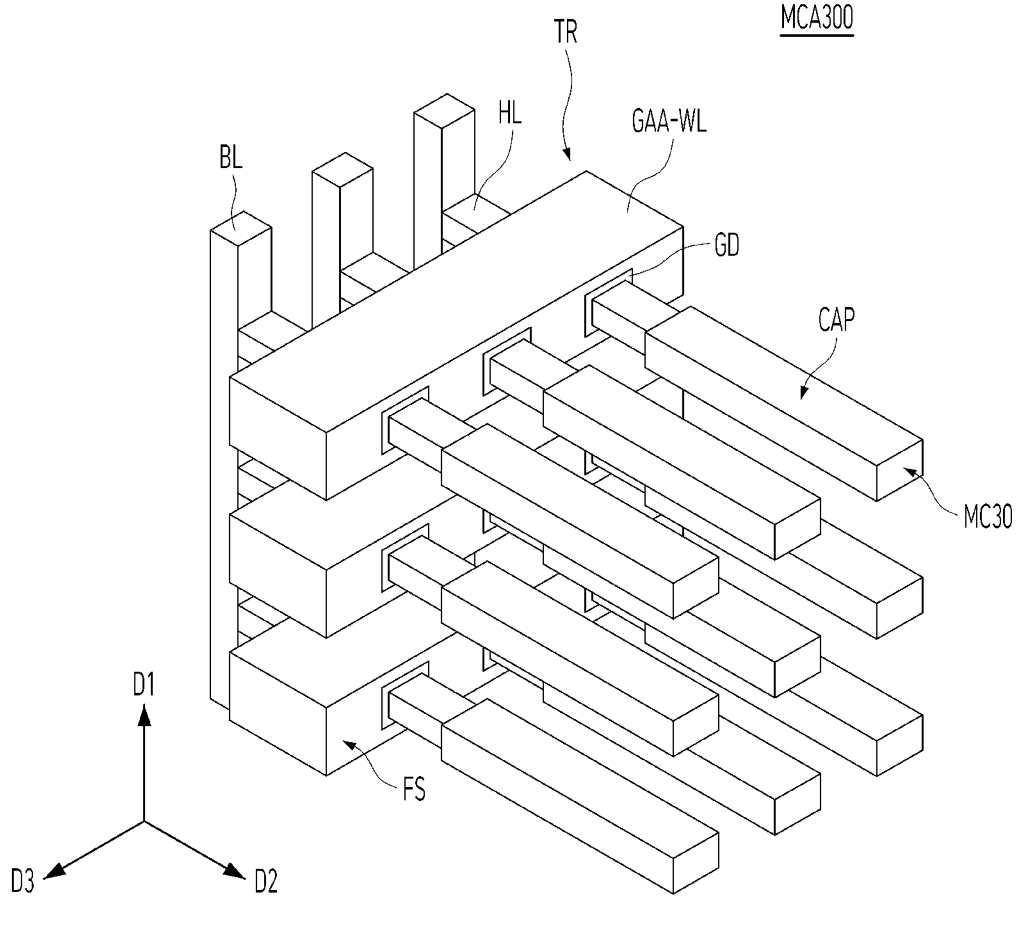

FIGS. 26 to 28 are perspective views illustrating memory cell arrays according to other embodiments of the present disclosure. Memory cell arrays MCA100, MCA200, and MCA300 may each be similar to the memory cell array MCA illustrated in FIG. 3A. Hereinafter, for a detailed description of redundant components, reference may be made to the aforementioned embodiments.

As illustrated in FIG. 26, the memory cell array MCA100 may include a plurality of memory cells MC10.

The memory cell array MCA100 may include a 3-D array of the memory cells MC10. The 3-D array of the memory cells MC10 may include a column array of the memory cells MC10 and a row array of the memory cells MC10. A plurality of memory cells MC10 may be stacked in the column array of the memory cells MC10 in a first direction D1. A plurality of memory cells MC10 may be horizontally disposed in the row array of the memory cells MC10 in a second direction D2 and a third direction D3.

The individual memory cell MC10 may include a first conductive line BL, a switching element TR, and a data storage element CAP. For a detailed description of the first conductive line BL and the data storage element CAP, reference may be made to the aforementioned embodiments.

The switching element TR may include a horizontal layer HL and a second conductive line DWL. The horizontal layer HL may extend in the second direction D2. The second conductive line DWL may extend in the third direction D3.

The second conductive line DWL may have a double structure. For example, the second conductive line DWL may include an upper horizontal line G1 and a lower horizontal line G2 that face each other with the horizontal layer HL interposed therebetween. As illustrated in FIG. 3B, the inter-level dielectric layer GD may be formed on the upper and lower surfaces of the horizontal layer HL.

The upper horizontal line G1 and the lower horizontal line G2 may each include a pair of flat sidewalls FS that extend in the third direction D3. The flat sidewall FS may denote a vertical sidewall. The flat sidewall FS may have a linear shape extending in the third direction D3.

As illustrated in FIG. 27, the memory cell array MCA200 may include a plurality of memory cells MC20.

The memory cell array MCA200 may include a 3-D array of the memory cells MC20. The 3-D array of the memory cells MC20 may include a column array of the memory cells MC20 and a row array of the memory cells MC20. A plurality of memory cells MC20 may be stacked in the column array of the memory cells MC20 in the first direction D1. A plurality of memory cells MC20 may be horizontally disposed in the row array of the memory cells MC20 in the second direction D2 and the third direction D3.

The individual memory cell MC20 may include a first conductive line BL, a switching element TR, and a data storage element CAP. For a detailed description of the first conductive line BL and the data storage element CAP, reference may be made to the aforementioned embodiments.

The switching element TR may include a horizontal layer HL and a second conductive line SWL. The horizontal layer HL may extend in a second direction D2. The second conductive line SWL may extend in a third direction D3.

The second conductive line SWL may have a single structure. For example, the second conductive line SWL may be disposed over the horizontal layer HL. As illustrated in FIG. 3B, the inter-level dielectric layer GD may be formed between an upper surface of the horizontal layer HL and the second conductive line SWL. In another embodiment, the second conductive line SWL may be disposed under the horizontal layer HL.

The second conductive line SWL may include a pair of flat sidewalls FS that extend in the third direction D3. The flat sidewall FS may denote a vertical sidewall.

In another embodiment, as illustrated in FIG. 1C, the second conductive line SWL may include the channel overlapping portion WLP and the channel non-overlapping portion NOL.

As illustrated in FIG. 28, the memory cell array MCA300 may include a plurality of memory cells MC30.

The memory cell array MCA300 may include a 3-D array of the memory cells MC30. The 3-D array of the memory cells MC30 may include a column array of the memory cells MC30 and a row array of the memory cells MC30. A plurality of memory cells MC30 may be stacked in the column array of the memory cells MC30 in a first direction D1. A plurality of memory cells MC30 may be horizontally disposed in the row array of the memory cells MC30 in a second direction D2 and a third direction D3.

The individual memory cell MC30 may include a first conductive line BL, a switching element TR, and a data storage element CAP. For a detailed description of the first conductive line BL and the data storage element CAP, reference may be made to the aforementioned embodiments.

The switching element TR may include a horizontal layer HL and a second conductive line GAA-WL. The horizontal layer HL may extend in the second direction D2. The second conductive line GAA-WL may extend in the third direction D3.

The second conductive line GAA-WL may have a gate all around structure GAA. For example, the second conductive line GAA-WL may extend in the third direction D3 while surrounding the horizontal layers HL. An inter-level dielectric layer GD may be formed between the horizontal layer HL and the second conductive line GAA-WL. The inter-level dielectric layer GD may surround the individual horizontal layers HL.

The second conductive line GAA-WL may include a pair of flat sidewalls FS that extend in the third direction D3. The flat sidewall FS may denote a vertical sidewall.

The present technology can enhance the supporting force of the supporter by minimizing a loss of the supporter because the patterns of the preliminary horizontal layers are trimmed after the inter-level dielectric layers are trimmed.

It will be evident to a person having ordinary knowledge in the art to which the present disclosure pertains that the embodiments of the present disclosure described above are not limited by the aforementioned embodiments and the accompanying drawings and that the embodiments may be modified, and changed in various ways without departing from the technical spirit of the present disclosure.

While the present disclosure has been shown and described with reference to certain embodiments thereof, it will be understood by those skilled in the art that various changes in form and details may be made therein without departing from the scope of the present disclosure and any equivalents. Therefore, the scope of the present disclosure should not be limited to the above-described embodiments but should include the equivalents thereof.

In the above-described embodiments, all operations may be selectively performed, or part of the operations may be omitted. In each embodiment, the operations are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

The embodiments of the present disclosure have been described in the drawings and specification. Although specific terminologies are used here, those are only to describe the embodiments of the present disclosure. Therefore, the present disclosure is not restricted to the above-described embodiments and many variations are possible within the scope of the present disclosure. It should be apparent to those skilled in the art that various modifications can be made on the basis of the technological scope of the present disclosure in addition to the embodiments disclosed herein. Furthermore, the embodiments may be combined to form additional embodiments.

What is claimed is:

1. A method of manufacturing a semiconductor device, the method comprising:
- forming a vertical stack comprising a plurality of recess target layers spaced apart from each other in a first direction over a lower structure;
- forming preliminary horizontal layers by recessing the recess target layers in a second direction perpendicular to the first direction;
- forming dielectric target layers on the preliminary horizontal layers;
- forming conductive target layers on the dielectric target layers;
- forming an inter-level dielectric layer by trimming the dielectric target layers in a third direction that intersects the second direction;
- forming horizontal layers by trimming the preliminary horizontal layers in the third direction; and
- forming trimmed target layers by trimming the conductive target layers in the third direction.

2. The method of claim 1, wherein a trimming width of the dielectric target layer and a trimming width of the preliminary horizontal layers are equal to each other.

3. The method of claim 1, further comprising forming a horizontal layer level spacer on trimmed sides of the horizontal layers before trimming the conductive target layer.

4. The method of claim 1, wherein:
- the dielectric target layer comprises silicon oxide, and
- the preliminary horizontal layers each comprise single crystalline silicon.

5. The method of claim 1, wherein forming the preliminary horizontal layers comprises:
- forming a plurality of sacrificial vertical openings that vertically extend in the first direction and are spaced apart from each other in the second direction perpendicular to the first direction, by etching the vertical stack; and
- recessing the recess target layers in the second direction from the sacrificial vertical openings.

6. The method of claim 1, further comprising:
- before forming the preliminary horizontal layers,
- forming sacrificial isolation openings that vertically extend in the first direction by etching the vertical stack;
- forming sacrificial isolation layers that fill the sacrificial isolation openings; and
- forming a plurality of sacrificial vertical openings that vertically extend in the first direction and are spaced apart from each other in the second direction perpendicular to the first direction by etching the vertical stack.

7. The method of claim 1, further comprising forming cell isolation openings that expose the preliminary horizontal layers, the dielectric target layers, and the conductive target layers in the third direction, after forming the conductive target layers on the dielectric target layers.

8. The method of claim 1, wherein the conductive target layers each comprise a metal-based material that surrounds the preliminary horizontal layer on the dielectric target layers.

9. The method of claim 1, further comprising:
- after forming the trimmed target layers,
- forming a horizontal conductive line extending in a direction that intersects the horizontal layers on the inter-level dielectric layers by horizontally recessing edge portions on both sides of the trimmed target layers;
- forming a vertical conductive line that is connected to first edges of the horizontal layers; and
- forming a data storage element that is connected to second edges of the horizontal layers.

10. The method of claim 9, further comprising:
- forming a first contact node between the vertical conductive line and the first edges of the horizontal layers; and
- forming a second contact node between the second edges of the horizontal layers and the data storage element.

11. The method of claim 10, wherein the first and second contact nodes each comprise polysilicon into which impurities have been doped.

12. The method of claim 10, further comprising:
- forming a first doped region within each of the first edges of the horizontal layers; and
- forming a second doped region within each of the second edges of the horizontal layers.

13. The method of claim 1, wherein a cross section of each of the horizontal layers has a cross shape.

* * * * *